(12) United States Patent
Zhang

(10) Patent No.: US 10,157,577 B2
(45) Date of Patent: Dec. 18, 2018

(54) SHIFT REGISTER ELEMENT, GATE DRIVER CIRCUIT, AND ORGANIC ELECTROLUMINESCENT DISPLAY PANEL

(71) Applicants: BOE Technology Group Co., Ltd., Beijing (CN); Chengdu BOE Optoelectronics Technology Co., Ltd., Chengdu (Sichuan Province) (CN)

(72) Inventor: Kai Zhang, Beijing (CN)

(73) Assignees: BOE Technology Group Co., Ltd., Beijing (CN); Chengdu BOE Optoelectronics Technology Co., Ltd., Chengdu (Sichuan Province) (CN)

( * ) Notice: Subject to any disclaimer, the term of this patent is extended or adjusted under 35 U.S.C. 154(b) by 0 days.

(21) Appl. No.: 15/718,468

(22) Filed: Sep. 28, 2017

(65) Prior Publication Data

US 2018/0233090 A1    Aug. 16, 2018

(30) Foreign Application Priority Data

Feb. 14, 2017   (CN) .......................... 2017 1 0078261

(51) Int. Cl.
*G09G 3/36*       (2006.01)
*G09G 3/3266*     (2016.01)
*G11C 19/28*      (2006.01)

(52) U.S. Cl.
CPC ........... *G09G 3/3266* (2013.01); *G11C 19/28* (2013.01); *G09G 2310/0286* (2013.01)

(58) Field of Classification Search
CPC ................. G09G 3/3677; G09G 5/003; G09G 2310/0286; G09G 2310/08; G09G 2330/021; G09G 3/3233; G09G 3/3266; G09G 2300/0819; G09G 2300/0842; G09G 2300/0861; G09G 2310/0262; G09G 2310/0278; G11C 19/287
See application file for complete search history.

(56) References Cited

U.S. PATENT DOCUMENTS

| 2013/0342584 A1* | 12/2013 | Song ........................ G09G 3/30 345/690 |
| 2015/0170568 A1* | 6/2015 | Lee ....................... G11C 19/287 345/690 |
| 2016/0019833 A1* | 1/2016 | Wei ...................... G09G 3/3233 345/690 |

FOREIGN PATENT DOCUMENTS

CN            104157236 A     11/2014

* cited by examiner

*Primary Examiner* — Nelson Rosario
(74) *Attorney, Agent, or Firm* — Arent Fox LLP

(57) ABSTRACT

Disclosed are a shift register element, a gate driver circuit, and an organic electroluminescent display panel, and the shift register element includes: a first input module, a first control module, a first scan signal output module, and a first light emission signal output module, or a second input module, a second control module, a second scan signal output module, and a second light emission signal output module, where these four modules can cooperate with each other to output both a scan signal and a light emission signal so as to lower the complexity of the circuit, to reduce a space to be occupied, and to facilitate a design of a display panel with a narrow border.

15 Claims, 17 Drawing Sheets

SHIFT REGISTER ELEMENT, GATE DRIVER CIRCUIT, AND ORGANIC ELECTROLUMINESCENT DISPLAY PANEL

CROSS-REFERENCE TO RELATED APPLICATION

This application claims priority of Chinese Patent Application No. 201710078261.9, filed on Feb. 14, 2017, which is hereby incorporated by reference in its entirety.

FIELD

This disclosure relates to the field of display technologies, and particularly to a shift register element, a gate driver circuit, and an organic electroluminescent display panel.

BACKGROUND

An Organic Light Emitting Diode (OLED) display panel is one of focuses in the ongoing researches on a flat panel display. The OLED display panel typically emits light and display by driving OLED elements using pixel circuits in pixels. In order to enable the OLED display panel to emit light, typically at least scan signals and light emission signals need to be input to the pixel circuits. At present a gate driver circuit is typically arranged in a non-display area of the OLED display panel to provide a desirable scan signal, and a light emission driver circuit is typically arranged in the non-display area of the OLED display panel to provide a desirable light emission signal.

SUMMARY

Some embodiments of the disclosure provide a shift register element including: a first input module, a first control module, a first scan signal output module, and a first light emission signal output module, the first input module includes a first terminal connected with an input signal terminal, a second terminal connected with a first clock signal terminal, a third terminal connected with a second clock signal terminal, a fourth terminal connected with a first reference signal terminal, a fifth terminal connected with a first node, and a sixth terminal connected with a second node; and the first input module is configured to be controlled by the first clock signal terminal to provide the first node with a signal of the input signal terminal, and to be controlled by the second clock signal terminal to provide the second node with a signal of the first reference signal terminal; the first control module includes a first terminal connected with the first node, and a second terminal connected with the second node; and the first control module is configured to make the potential of the signal of the first node opposite to the potential of the signal of the second node; the first scan signal output module includes a first terminal connected with a second reference signal terminal, a second terminal connected with a third clock signal terminal, a third terminal connected with the first node, a fourth terminal connected with the second node, and a fifth terminal connected with a scan signal output terminal of the shift register element; and the first scan signal output module is configured to provide the scan signal output terminal with a signal of the third clock signal terminal when the potential of the signal of the first node is a first potential, and to provide the scan signal output terminal with a signal of the second reference signal terminal when the potential of the signal of the second node is the first potential; and to maintain a stable difference in voltage between the third terminal of the first scan signal output module, and the scan signal output terminal when the first node is floating, and to maintain a stable difference in voltage between the second node and the scan signal output terminal when the second node is floating; and the first light emission signal output module includes a first terminal connected with the first reference signal terminal, a second terminal connected with the second reference signal terminal, a third terminal connected with the first node, and a fourth terminal connected with a light emission signal output terminal of the shift register element; and the first light emission signal output module is configured to provide the light emission signal output terminal with the signal of the second reference signal terminal when the potential of the signal of the first node is the first potential, and to provide the light emission signal output terminal with the signal of the first reference signal terminal when the potential of the signal of the first node is a second potential.

Correspondingly some embodiments of the disclosure further provide a shift register element including: a second input module, a second control module, a second scan signal output module, and a second light emission signal output module, the second input module includes a first terminal connected with an input signal terminal, a second terminal connected with a first clock signal terminal, a third terminal connected with a second clock signal terminal, a fourth terminal connected with a first reference signal terminal, a fifth terminal connected with a first node, and a sixth terminal connected with a second node; and the second input module is configured to be controlled by the first clock signal terminal to provide the first node with a signal of the input signal terminal, and to be controlled by the second clock signal terminal to provide the second node with a signal of the first reference signal terminal; the second control module includes a first terminal connected with the first node, and a second terminal connected with the second node; and the second control module is configured to make the potential of the signal of the first node opposite to the potential of the signal of the second node; the second scan signal output module includes a first terminal connected with the second reference signal terminal, a second terminal connected with a third clock signal terminal, a third terminal connected with the first node, a fourth terminal connected with the second node, and a fifth terminal connected with a scan signal output terminal of the shift register element; and the second scan signal output module is configured to provide the scan signal output terminal with a signal of the third clock signal terminal when the potential of the signal of the first node is a first potential, and to provide the scan signal output terminal with a signal of the second reference signal terminal when the potential of the signal of the second node is the first potential; and to maintain a stable difference in voltage between the third terminal of the second scan signal output module, and the scan signal output terminal when the first node is floating, and to maintain a stable difference in voltage between the second node and the scan signal output terminal when the second node is floating; and the second light emission signal output module includes a first terminal connected with the first reference signal terminal, a second terminal connected with the second reference signal terminal, a third terminal connected with the second node, and a fourth terminal connected with a light emission signal output terminal of the shift register element; and the second light emission signal output module is configured to provide the light emission signal output terminal with the signal of the second reference signal terminal when the potential of the signal of the second node is the second potential, and to provide the light emission signal output terminal with the signal of the first reference signal terminal when the potential of the signal of the second node is the first potential.

Correspondingly some embodiments of the disclosure further provide a gate driver circuit including a plurality of the aforementioned shift register elements, which are concentrated, the input signal terminal of a first level of shift register element is connected with a frame trigger signal terminal; and the input signal terminals of other levels of shift register elements are connected respectively with scan signal output terminals of preceding levels of shift register elements, except for the first level of shift register element; the shift register element comprises: a first input module, a first control module, a first scan signal output module, and a first light emission signal output module, the first input module comprises a first terminal connected with an input signal terminal, a second terminal connected with a first clock signal terminal, a third terminal connected with a second clock signal terminal, a fourth terminal connected with a first reference signal terminal, a fifth terminal connected with a first node, and a sixth terminal connected with a second node; and the first input module is configured to be controlled by the first clock signal terminal to provide the first node with a signal of the input signal terminal, and to be controlled by the second clock signal terminal to provide the second node with a signal of the first reference signal terminal; the first control module comprises a first terminal connected with the first node, and a second terminal connected with the second node; and the first control module is configured to make a potential of the signal of the first node opposite to a potential of the signal of the second node; the first scan signal output module comprises a first terminal connected with a second reference signal terminal, a second terminal connected with a third clock signal terminal, a third terminal connected with the first node, a fourth terminal connected with the second node, and a fifth terminal connected with a scan signal output terminal of the shift register element; and the first scan signal output module is configured to provide the scan signal output terminal with a signal of the third clock signal terminal when the potential of the signal of the first node is a first potential, and to provide the scan signal output terminal with a signal of the second reference signal terminal when the potential of the signal of the second node is the first potential; and to maintain a stable difference in voltage between the third terminal of the first scan signal output module and the scan signal output terminal when the first node is floating, and to maintain a stable difference in voltage between the second node and the scan signal output terminal when the second node is floating; and the first light emission signal output module comprises a first terminal connected with the first reference signal terminal, a second terminal connected with the second reference signal terminal, a third terminal connected with the first node, and a fourth terminal connected with a light emission signal output terminal of the shift register element; and the first light emission signal output module is configured to provide the light emission signal output terminal with the signal of the second reference signal terminal if the potential of the signal of the first node is the first potential, and to provide the light emission signal output terminal with the signal of the first reference signal terminal when the potential of the signal of the first node is a second potential; or the shift register element comprises: a second input module, a second control module, a second scan signal output module, and a second light emission signal output module, the second input module comprises a first terminal connected with an input signal terminal, a second terminal connected with a first clock signal terminal, a third terminal connected with a second clock signal terminal, a fourth terminal connected with a first reference signal terminal, a fifth terminal connected with a first node, and a sixth terminal connected with a second node; and the second input module is configured to be controlled by the first clock signal terminal to provide the first node with a signal of the input signal terminal, and to be controlled by the second clock signal terminal to provide the second node with a signal of the first reference signal terminal; the second control module comprises a first terminal connected with the first node, and a second terminal connected with the second node; and the second control module is configured to make a potential of the signal of the first node opposite to a potential of the signal of the second node; the second scan signal output module comprises a first terminal connected with the second reference signal terminal, a second terminal connected with a third clock signal terminal, a third terminal connected with the first node, a fourth terminal connected with the second node, and a fifth terminal connected with a scan signal output terminal of the shift register element; and the second scan signal output module is configured to provide the scan signal output terminal with a signal of the third clock signal terminal when the potential of the signal of the first node is a first potential, and to provide the scan signal output terminal with a signal of the second reference signal terminal when the potential of the signal of the second node is the first potential; and to maintain a stable difference in voltage between the third terminal of the second scan signal output module and the scan signal output terminal when the first node is floating, and to maintain a stable difference in voltage between the second node and the scan signal output terminal when the second node is floating; and the second light emission signal output module comprises a first terminal connected with the first reference signal terminal, a second terminal connected with the second reference signal terminal, a third terminal connected with the second node, and a fourth terminal connected with a light emission signal output terminal of the shift register element; and the second light emission signal output module is configured to provide the light emission signal output terminal with the signal of the second reference signal terminal when the potential of the signal of the second node is the second potential, and to provide the light emission signal output terminal with the signal of the first reference signal terminal when the potential of the signal of the second node is the first potential.

Correspondingly some embodiments of the disclosure further provide an organic electroluminescent display panel including aforementioned gate driver circuit, and a plurality of signal line groups including gate lines and light emission signal lines, each of the signal line groups corresponds to one of the shift register elements in the gate driver circuit; and gate lines in each of the signal line groups are connected with the scan signal output terminals of a shift register element corresponding to each of the signal line groups, and the light emission signal lines are connected with the light emission signal output terminals of the shift register element corresponding to each of the signal line groups.

DETAILED DESCRIPTION OF THE EMBODIMENTS

In order to make the objects, the technical solutions, and the advantages of the disclosure more apparent, detailed implementations of a shift register element, a gate driver circuit, and an organic electroluminescent display panel according to the embodiments of the disclosure will be described below in details with reference to the drawings. It shall be appreciated that embodiments to be described below are only intended to illustrate and describe the disclosure, but not to limit the disclosure thereto, and the embodiments of the disclosure and the features in the embodiments can be combined with each other unless they conflict with each other.

Figure 1A:
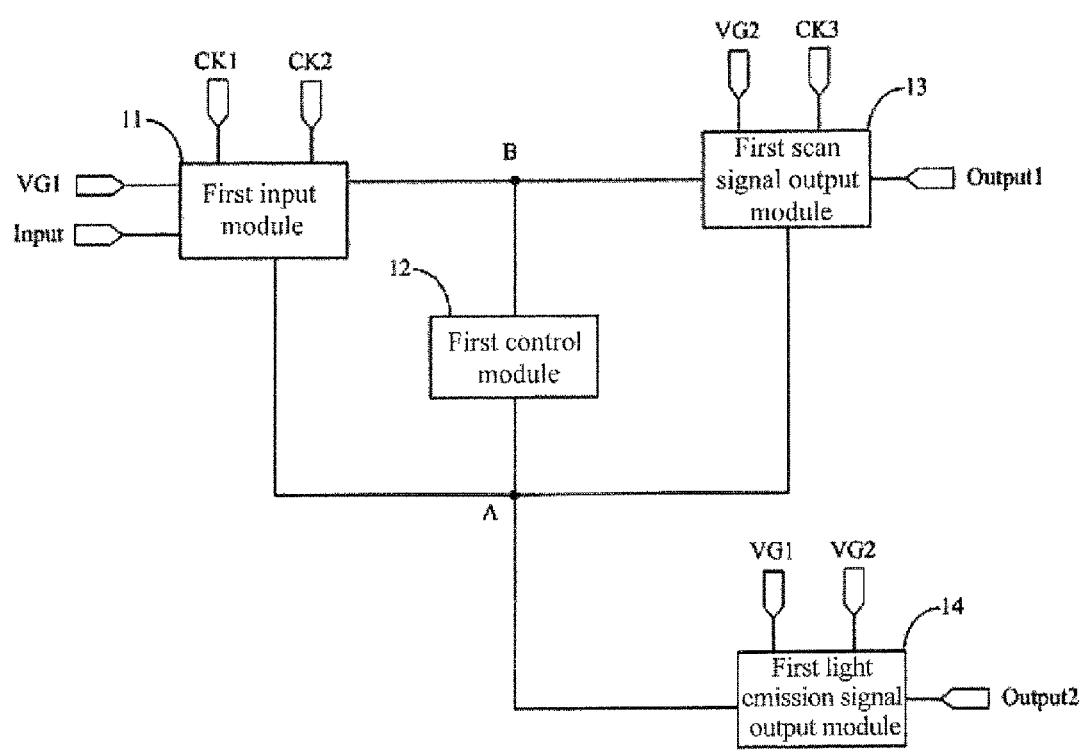
FIG. 1A is a first schematic structural diagram of a shift register element according to some embodiments of the disclosure.

Some embodiments of the disclosure provide a shift register element as illustrated in FIG. 1A including: a first input module 11, a first control module 12, a first scan signal output module 13, and a first light emission signal output module 14.

The first input module 11 includes a first terminal connected with an input signal terminal Input, a second terminal connected with a first clock signal terminal CK1, a third terminal connected with a second clock signal terminal CK2, a fourth terminal connected with a first reference signal terminal VG1, a fifth terminal connected with a first node A, and a sixth terminal connected with a second node B; and the first input module 11 is configured to be controlled by the first clock signal terminal CK1 to provide the first node A with a signal of the input signal terminal Input, and to be controlled by the second clock signal terminal CK2 to provide the second node B with a signal of the first reference signal terminal VG1.

The first control module 12 includes a first terminal connected with the first node A, and a second terminal connected with the second node B; and the first control module 12 is configured to make the potential of the signal of the first node A opposite to the potential of the signal of the second node B.

The first scan signal output module 13 includes a first terminal connected with a second reference signal terminal VG2, a second terminal connected with a third clock signal terminal CK3, a third terminal connected with the first node A, a fourth terminal connected with the second node B, and a fifth terminal connected with a scan signal output terminal Output1 of the shift register element; and the first scan signal output module 13 is configured to provide the scan signal output terminal Output1 with a signal of the third clock signal terminal CK3 if the potential of the signal of the first node A is a first potential, and to provide the scan signal output terminal Output1 with a signal of the second reference signal terminal VG2 if the potential of the signal of the second node B is the first potential; and to maintain a stable difference in voltage between the third terminal of the first scan signal output module 13, and the scan signal output terminal Output1 when the first node A is floating, and to maintain a stable difference in voltage between the second node B and the scan signal output terminal Output1 when the second node B is floating.

The first light emission signal output module 14 includes a first terminal connected with the first reference signal terminal VG1, a second terminal connected with the second reference signal terminal VG2, a third terminal connected with the first node A, and a fourth terminal connected with a light emission signal output terminal Output2 of the shift register element; and the first light emission signal output module 14 is configured to provide the light emission signal output terminal Output2 with the signal of the second reference signal terminal VG2 when the potential of the signal of the first node A is the first potential, and to provide the light emission signal output terminal Output2 with the signal of the first reference signal terminal VG1 when the potential of the signal of the first node A is a second potential.

The shift register element above according to embodiments of the disclosure includes: the first input module, the first control module, the first scan signal output module, and the first light emission signal output module, where these four modules can cooperate with each other to output a scan signal and a light emission signal simultaneously so as to lower the complexity of the circuit, to reduce a space to be occupied, and to facilitate a design of a display panel with a narrow border.

In an implementation, in the shift register element above according to embodiments of the disclosure, when the potential of an effective pulse signal of the input signal terminal is a low potential, the potential of the first reference signal terminal is a low potential, the potential of the second reference signal terminal is a high potential, the first potential is a low potential, and the second potential is a high potential; or when the potential of an effective pulse signal of the input signal terminal is a high potential, the potential of the first reference signal terminal is a high potential, the potential of the second reference signal terminal is a low potential, the first potential is a high potential, and the second potential is a low potential.

Figure 1B:
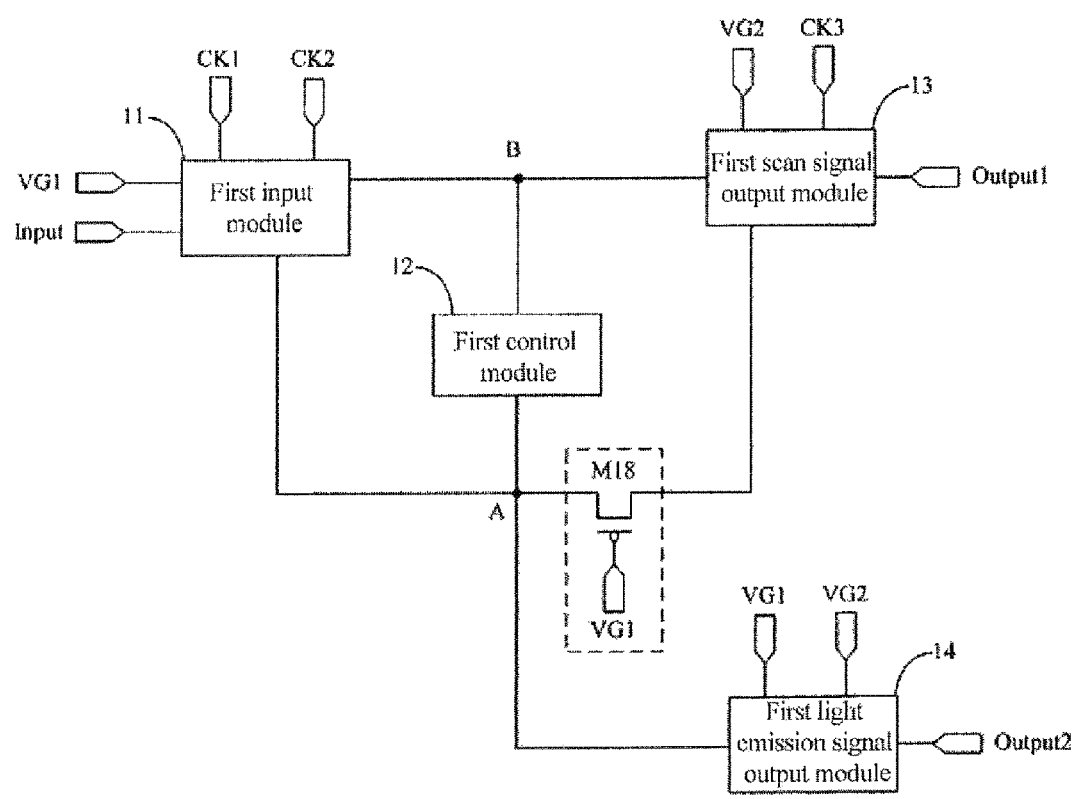
FIG. 1B is a second schematic structural diagram of the shift register element according to some embodiments of the disclosure.

Furthermore in order to enable the potential of the first node A to be stable, in an implementation, in the shift register element above according to embodiments of the disclosure, as illustrated in FIG. 1B, the shift register element can further include an eighteenth switch transistor M18, where the first node A is connected with the third terminal of the first scan signal output module 13 through the eighteenth switch transistor M18, and the eighteenth switch transistor M18 includes a control pole connected with the first reference signal terminal VG1, a first pole connected with the third terminal of the first scan signal output module 13, and a second pole connected with the first node A.

In an implementation, in the shift register element above according to embodiments of the disclosure, as illustrated in FIG. 1B, the eighteenth switch transistor M18 can be a P-type transistor, and the potential of an effective pulse signal of the input signal terminal Input can be a low potential. Of course, the eighteenth switch transistor can alternatively be a N-type transistor, and at this time, the potential of an effective pulse signal of the input signal terminal can be a high potential. In a practical application, the type of the eighteenth switch transistor will be determined as needed in a practical application instead of being limited to any particular type.

In an implementation, in the shift register element above according to embodiments of the disclosure, when the eighteenth switch transistor is controlled by the first reference signal terminal to be switched on, it provides the third terminal of the first scan signal output module with the signal of the first node. In a practical application, as illustrated in FIG. 1B, when the eighteenth switch transistor M18 is a P-type transistor, the eighteenth switch transistor M18 is switched on when a relationship between a difference in voltage $V_{gs}$ (M18) of the control pole thereof and the first pole thereof and threshold voltage thereof $V_{th}$ (M18) satisfies the equation of $V_{gs}$ (M18)<$V_{th}$ (M18); or when the eighteenth switch transistor M18 is an N-type transistor, the eighteenth switch transistor M18 is switched on when a relationship between the difference in voltage $V_{gs}$ (M18) of the control pole thereof and the first pole thereof, and threshold voltage thereof $V_{th}$ (M18) satisfies the equation of $V_{gs}$ (M18)>$V_{th}$ (M18).

The disclosure will be described below in details in connection with embodiments thereof. It shall be noted that the embodiments will be described for the purpose of better setting forth the disclosure, but not limiting the disclosure thereto.

Optionally in an implementation, in the shift register element above according to embodiments of the disclosure, as illustrated in FIG. 2A to FIG. 3C, the first input module 11 can include: a fourteenth switch transistor M14 and a fifteenth switch transistor M15.

The fourteenth switch transistor M14 includes a control pole connected with the first clock signal terminal CK1, a first pole connected with the input signal terminal Input, and a second pole connected with the first node A.

The fifteenth switch transistor M15 includes a control pole connected with the second clock signal terminal CK2, a first pole connected with the first reference signal terminal VG1, and a second pole connected with the second node B.

In an implementation, in the shift register element above according to embodiments of the disclosure, as illustrated in FIG. 2A to FIG. 3C, the fourteenth switch transistor M14 and the fifteenth switch transistor M15 can be P-type transistors, and the potential of an effective pulse signal of the input signal terminal Input can be a low potential. Of course, the fourteenth switch transistor and the fifteenth switch transistor can alternatively be N-type transistors, and the potential of an effective pulse signal of the input signal terminal can be a high potential, although embodiments of the disclosure will not be limited thereto.

In an implementation, in the shift register element above according to the embodiment of the disclosure, when the fourteenth switch transistor is controlled by the first clock signal terminal to be switched on, it provides the first node with the signal of the input signal terminal. When the fifteenth switch transistor is controlled by the second clock signal terminal to be switched on, it provides the second node with the signal of the first reference signal terminal.

Optionally in an implementation, in the shift register element above according to embodiments of the disclosure, as illustrated in FIG. 2A to FIG. 3C, the first scan signal output module 13 can include: a sixteenth switch transistor M16, a seventeenth switch transistor M17, a second capacitor C2, and a third capacitor C3.

The sixteenth switch transistor M16 includes a control pole which is the third terminal of the first scan signal output module 13, a first pole connected with the third clock signal terminal CK3, and a second pole connected with the scan signal output terminal Output1.

The seventeenth switch transistor M17 includes a control pole connected with the second node B, a first pole connected with the second reference signal terminal VG2, and a second pole connected with the scan signal output terminal Output1.

The second capacitor C2 is connected between the control pole of the sixteenth switch transistor M16, and the scan signal output terminal Output1.

The third capacitor C3 is connected between the second node B and the scan signal output terminal Output1.

In an implementation, in the shift register element above according to embodiments of the disclosure, as illustrated in FIG. 2A to FIG. 3C, the sixteenth switch transistor M16 and the seventeenth switch transistor M17 can be P-type transistors, and the potential of an effective pulse signal of the input signal terminal Input can be a low potential. Of course, the sixteenth switch transistor and the seventeenth switch transistor can alternatively be N-type transistor, and the potential of an effective pulse signal of the input signal terminal can be a high potential, although embodiments of the disclosure will not be limited thereto.

In an implementation, in the shift register element above according to embodiments of the disclosure, when the sixteenth switch transistor is controlled by the signal of the control pole thereof to be switched on, it provides the scan signal output terminal with the signal of the third clock signal terminal. When the seventeenth switch transistor is controlled by the signal of the second node to be switched on, it provides the scan signal output terminal with the signal of the second reference signal terminal. When the first node is floating, a stable difference in voltage between the control pole of the sixteenth switch transistor, and the scan signal output terminal may be maintained due to bootstrapping of the second capacitor. When the second node is floating, a stable difference in voltage between the second node and the scan signal output terminal may be maintained due to bootstrapping of the third capacitor.

Optionally in an implementation, in the shift register element above according to embodiments of the disclosure, the first clock signal terminal CK1 and the second clock signal terminal CK2 are independent of each other, and as illustrated in FIG. 2A, FIG. 2B, FIG. 3A, and FIG. 3B, the first control module 12 can include: a first switch transistor M1 and a second switch transistor M2.

The first switch transistor M1 includes a control pole connected with the first node, a first pole connected with the second reference signal terminal VG2, and a second pole connected with the second node B.

The second switch transistor M2 includes a control pole connected with the second node B, a first pole connected with the second reference signal terminal VG2, and a second pole connected with the first node A.

In an implementation, in the shift register element above according to embodiments of the disclosure, as illustrated in FIG. 2A, FIG. 2B, FIG. 3A, and FIG. 3B, the first switch transistor M1 and the second switch transistor M2 can be P-type transistors, and the potential of an effective pulse signal of the input signal terminal Input can be a low potential. Of course, the first switch transistor and the second switch transistor can alternatively be N-type transistors, and the potential of an effective pulse signal of the input signal terminal can be a high potential, although embodiments of the disclosure will not be limited thereto.

In an implementation, in the shift register element above according to embodiments of the disclosure, when the first switch transistor is controlled by the signal of the first node to be switched on, it provides the second node with the signal of the second reference signal end. When the second switch transistor is controlled by the signal of the second node to be switched on, it provides the first node with the signal of the second reference signal end.

Figure 2A:
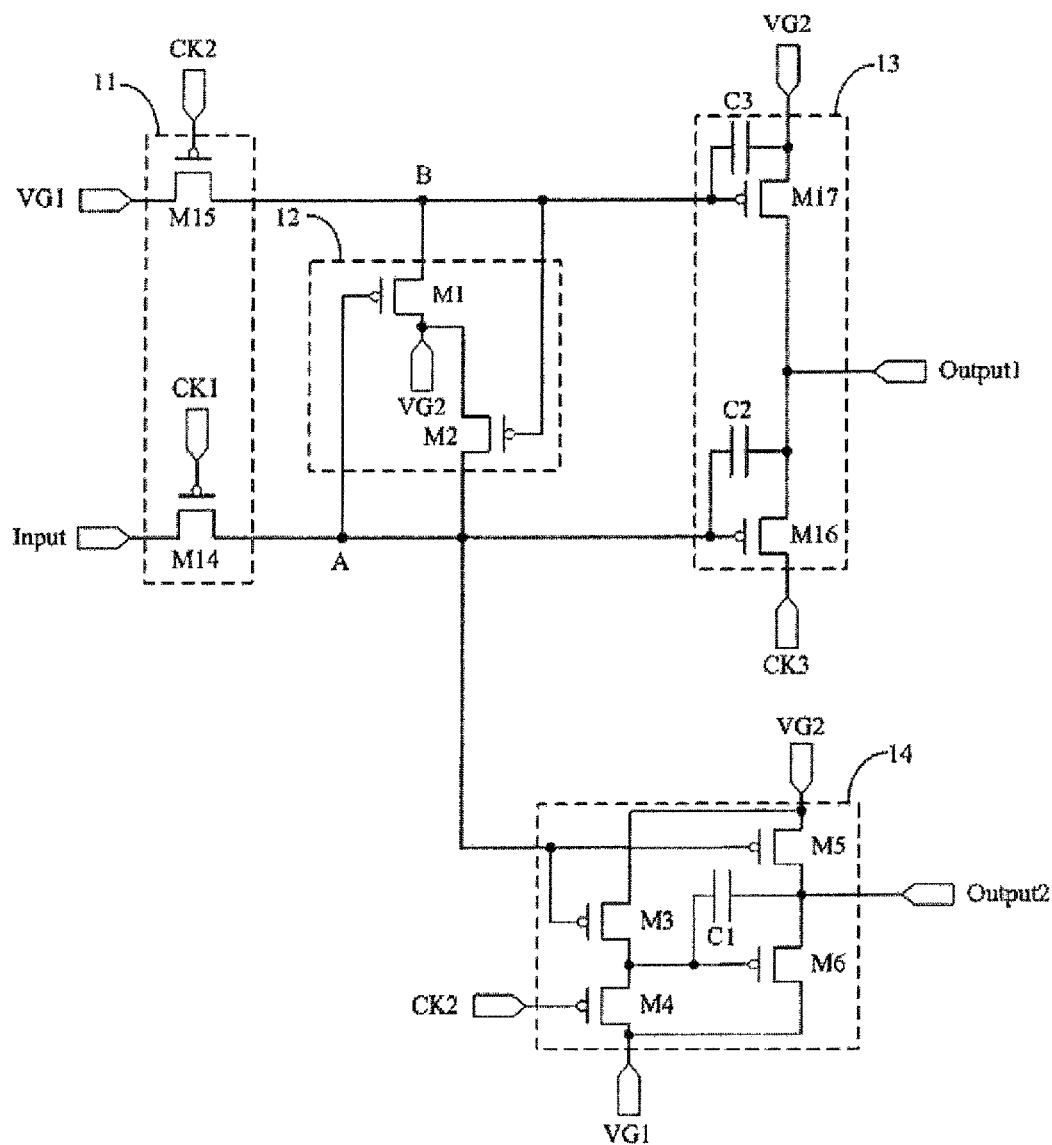
FIG. 2A is a first detailed schematic structural diagram of the shift register element illustrated in FIG. 1A.
Figure 3A:
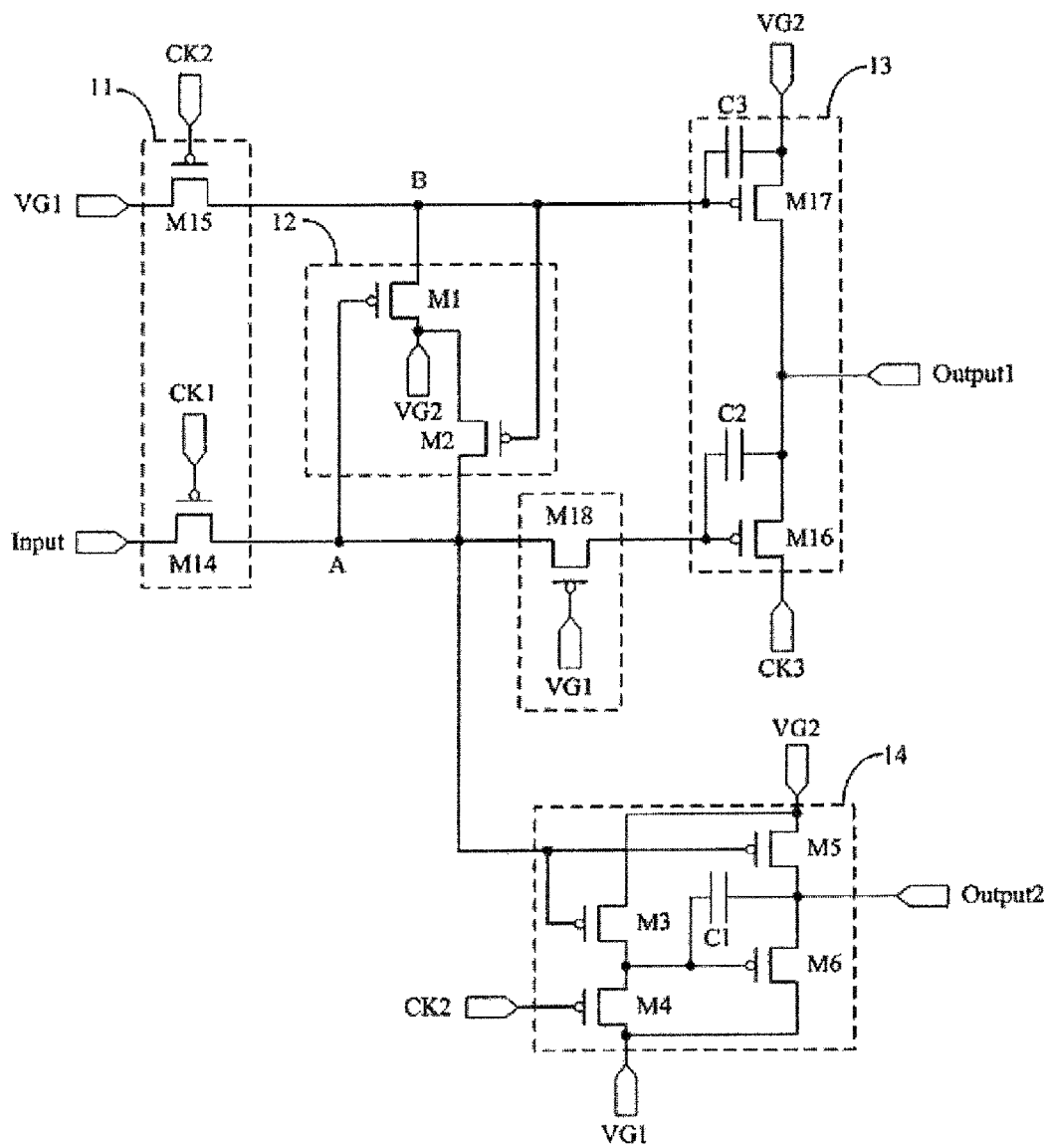
FIG. 3A is a first detailed schematic structural diagram of the shift register element illustrated in FIG. 1B.

Optionally in an implementation, in the shift register element above according to embodiments of the disclosure, the first clock signal end CK1 and the second clock signal end CK2 are independent of each other, and as illustrated in FIG. 2A and FIG. 3A, the first light emission signal output module 14 can include: a third switch transistor M3, a fourth switch transistor M4, a fifth switch transistor M5, a sixth switch transistor M6, and a first capacitor C1.

The third switch transistor M3 includes a control pole connected with the first node A, a first pole connected with the second reference signal terminal VG2, and a second pole connected with a control pole of the sixth switch transistor M6.

The fourth switch transistor M4 includes a control pole connected with the second clock signal terminal CK2, a first pole connected with the first reference signal terminal VG1, and a second pole connected with the control pole of the sixth switch transistor M6.

The fifth switch transistor M5 includes a control pole connected with the first node A, a first pole connected with the second reference signal terminal VG2, and a second pole connected with the light emission signal output terminal Output2.

The sixth switch transistor M6 includes a first pole connected with the first reference signal terminal VG1, and a second pole connected with the light emission signal output terminal Output2.

The first capacitor C1 is connected between the control pole of the sixth switch transistor M6 and the light emission signal output terminal Output2.

In an implementation, in the shift register element above according to embodiments of the disclosure, as illustrated in FIG. 2A and FIG. 3A, the third switch transistor M3, the fourth switch transistor M4, the fifth switch transistor M5, and the sixth switch transistor M6 can be P-type transistors, and the potential of an effective pulse signal of the input signal terminal Input can be a low potential. Of course, the third switch transistor, the fourth switch transistor, the fifth switch transistor, and the sixth switch transistor can be N-type transistors, and the potential of an effective pulse signal of the input signal terminal can be a high potential, although embodiments of the disclosure will not be limited thereto.

In an implementation, in the shift register element above according to embodiments of the disclosure, when the third switch transistor is controlled by the signal of the first node to be switched on, it provides the control pole of the sixth switch transistor with the signal of the second reference signal terminal. When the fourth switch transistor is controlled by the third clock signal terminal to be switched on, it provides the control pole of the sixth switch transistor with the signal of the first reference signal terminal. When the fifth switch transistor is controlled by the signal of the first node to be switched on, it provides the light emission signal output terminal with the signal of the second reference signal terminal. When the sixth switch transistor is controlled by the signal of the control pole thereof to be switched on, it provides the light emission signal output terminal with the signal of the first reference signal terminal. When the control pole of the sixth switch transistor is floating, a stable difference in voltage between the control pole of the sixth switch transistor, and the light emission signal output terminal may be maintained due to bootstrapping of the first capacitor.

Figure 2B:
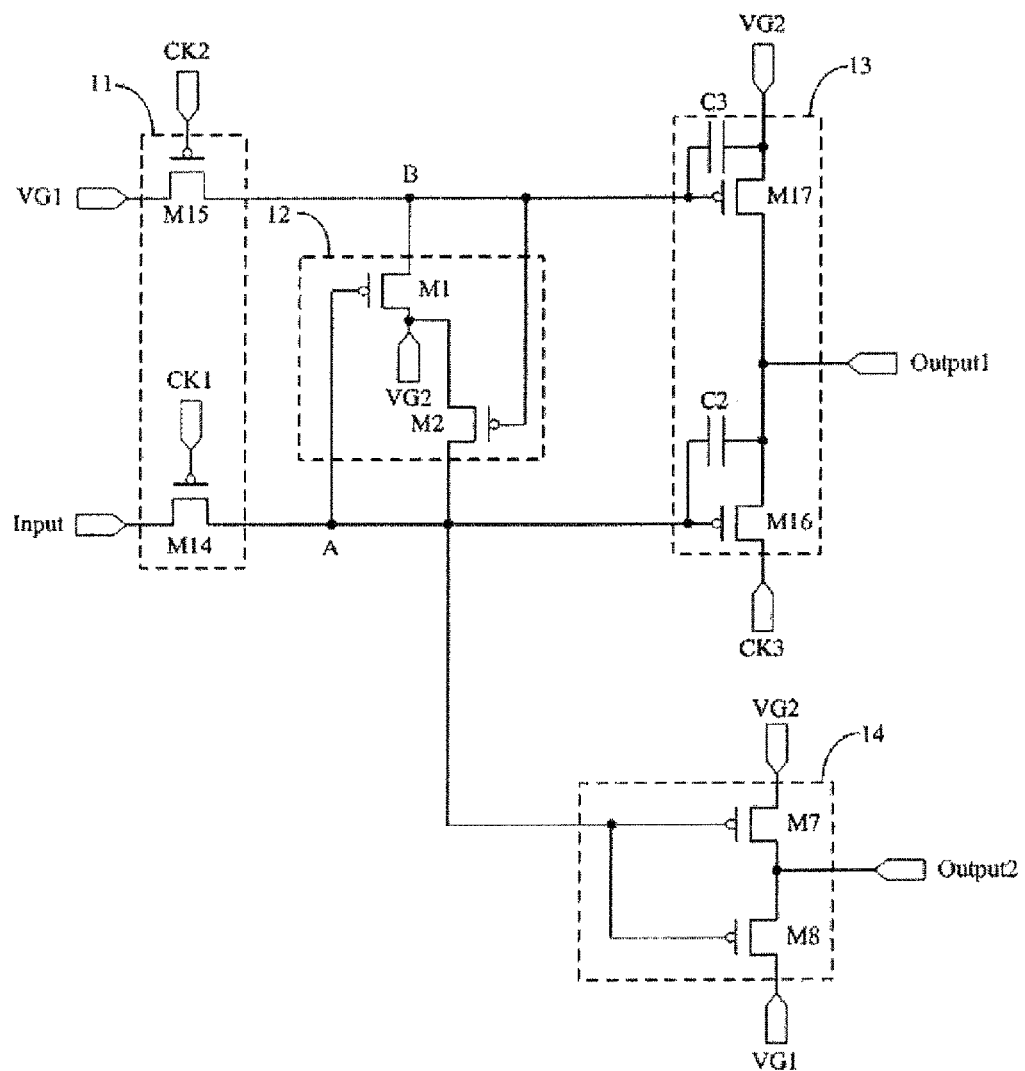
FIG. 2B is a second detailed schematic structural diagram of the shift register element illustrated in FIG. 1A.
Figure 3B:
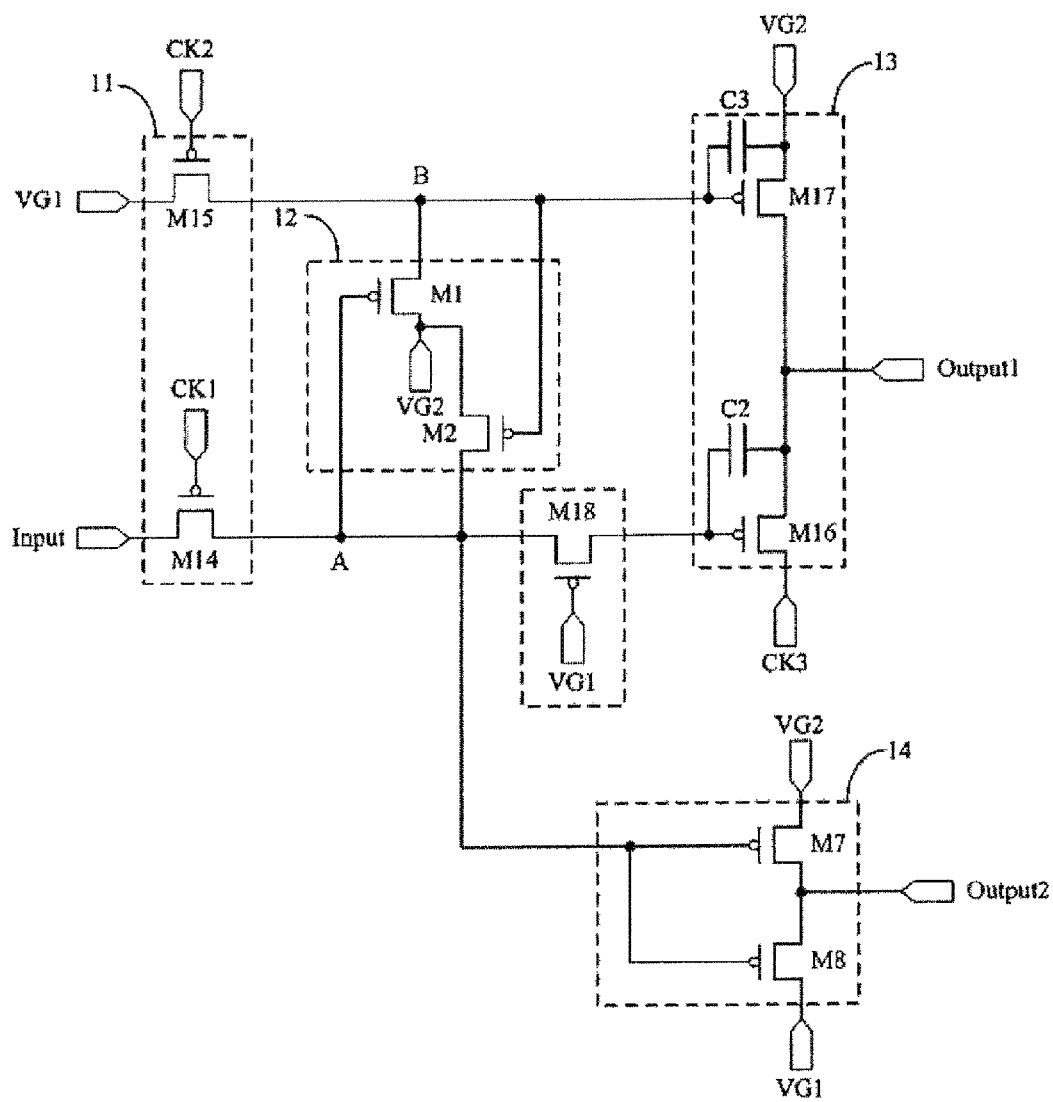
FIG. 3B is a second detailed schematic structural diagram of the shift register element illustrated in FIG. 1B.

Alternatively as illustrated in FIG. 2B and FIG. 3B, the first light emission signal output module 14 can include: a seventh switch transistor M7 and an eighth switch transistor M8.

The seventh switch transistor M7 includes a control pole connected with the first node A, a first pole connected with the second reference signal terminal VG2, and a second pole connected with the light emission signal output terminal Output2.

The eight switch transistor M8 includes a control pole connected with the first node A, a first pole connected with the first reference signal terminal VG1, and a second pole connected with the light emission signal output terminal Output2.

In an implementation, in the shift register element above according to embodiments of the disclosure, as illustrated in FIG. 2B and FIG. 3B, the seventh switch transistor M7 and the eight switch transistor M8 can be P-type transistors, and the potential of an effective pulse signal of the input signal terminal can be a low potential. Of course, the seventh switch transistor and the eight switch transistor can be N-type transistors, and the potential of an effective pulse signal of the input signal terminal can be a high potential, although embodiments of the disclosure will not be limited thereto.

In an implementation, in the shift register element above according to embodiments of the disclosure, when the seventh switch transistor is controlled by the signal of the first node to be switched on, it provides the light emission signal output terminal with the signal of the second reference signal terminal. When the eighth switch transistor is controlled by the signal of the first node to be switched on, it provides the light emission signal output terminal with the signal of the first reference signal terminal.

Figure 2C:
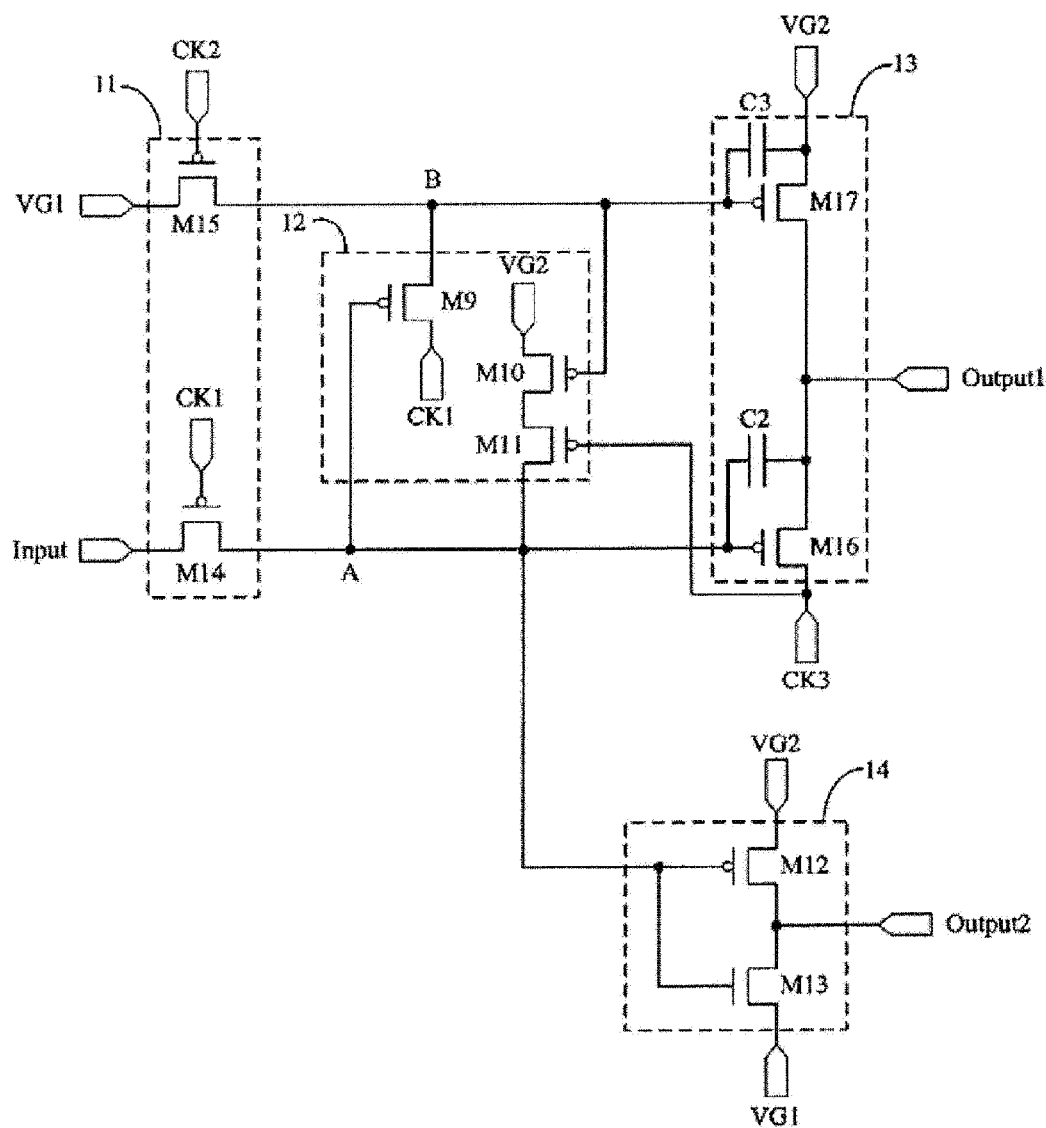
FIG. 2C is a third detailed schematic structural diagram of the shift register element illustrated in FIG. 1A.
Figure 3C:
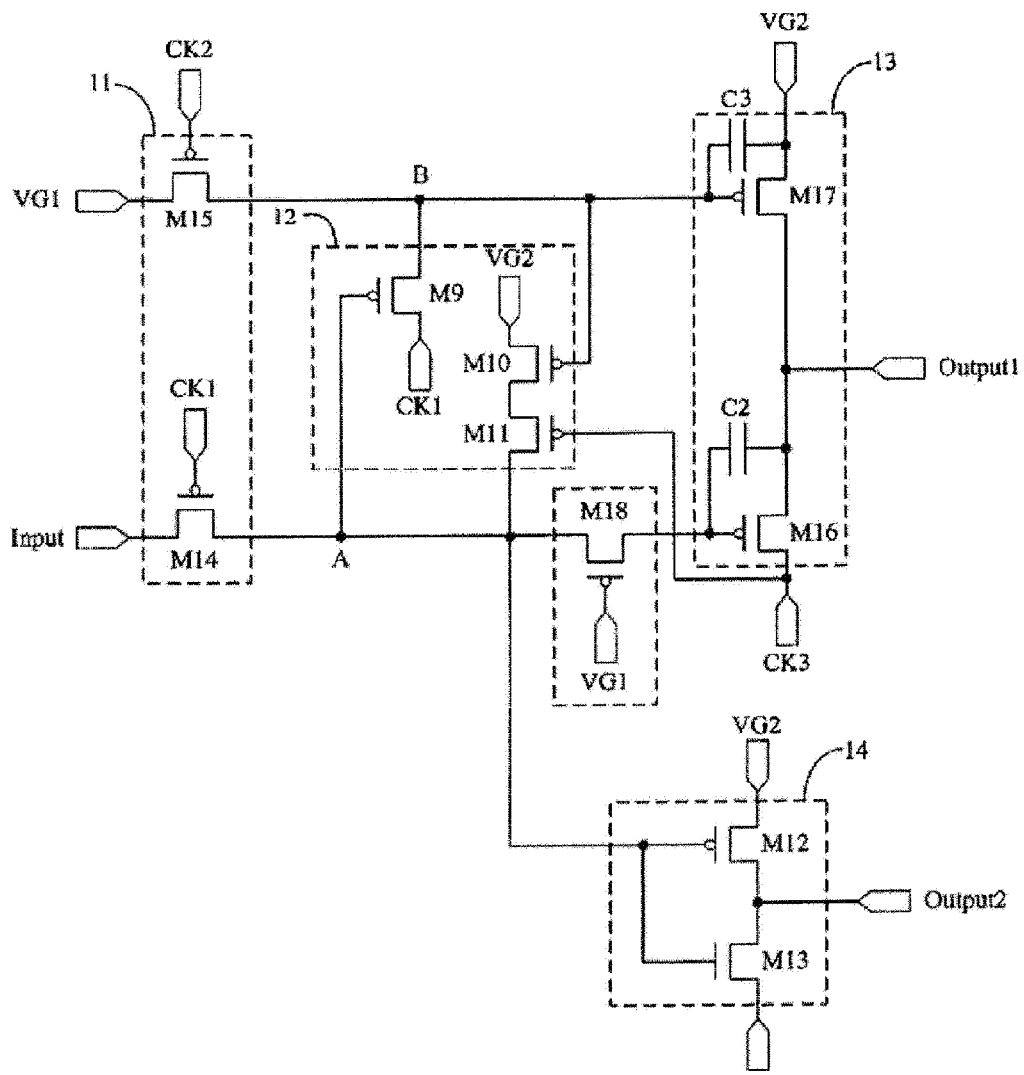
FIG. 3C is a third detailed schematic structural diagram of the shift register element illustrated in FIG. 1B.

Optionally in an implementation, in the shift register element above according to embodiments of the disclosure, the first clock signal terminal and the second clock signal terminal are the same signal terminal, and as illustrated in FIG. 2C and FIG. 3C, the first control module 12 can include: a ninth switch transistor M9, a tenth switch transistor M10, and an eleventh switch transistor M11.

The ninth switch transistor M9 includes a control pole connected with the first node A, a first pole connected with the first clock signal terminal CK1, and a second pole connected with the second node B.

The tenth switch transistor M10 includes a control pole connected with the second node B, a first pole connected with the second reference signal terminal VG2, and a second pole connected with the first pole of the eleventh switch transistor M11.

The eleventh switch transistor M11 includes a control pole connected with the third clock signal terminal CK3, and a second pole connected with the first node A.

In an implementation, in the shift register element above according to embodiments of the disclosure, as illustrated in FIG. 2C and FIG. 3C, the ninth switch transistor M9, the tenth switch transistor M10, and the eleventh switch transistor M11 can be P-type transistors, and the potential of an effective pulse signal of the input signal terminal Input can be a low potential. Of course, the ninth switch transistor, the tenth switch transistor, and the eleventh switch transistor can be N-type transistors, and the potential of an effective pulse signal of the input signal terminal can be a high potential, although embodiments of the disclosure will not be limited thereto.

In an implementation, in the shift register element above according to embodiments of the disclosure, when the ninth switch transistor is controlled by the signal of the first node to be switched on, it provides the second node with the signal of the first clock signal terminal. When the tenth switch transistor is controlled by the signal of the second node to be switched on, it provides the first pole of the eleventh switch transistor with the signal of the second reference signal terminal. When the eleventh switch transistor is controlled by the third clock signal terminal to be switched on, it provides the first node with the signal of the first pole thereof.

Optionally in an implementation, in the shift register element above according to embodiments of the disclosure, the first clock signal terminal and the second clock signal terminal are the same signal terminal, and as illustrated in FIG. 2C and FIG. 3C, the first light emission signal output module 14 can include: a twelfth switch transistor M12 and a thirteenth switch transistor M13.

The twelfth switch transistor M12 includes a control pole connected with the first node A, a first pole connected with the second reference signal terminal VG2, and a second pole connected with the light emission signal output terminal Output2.

The thirteenth switch transistor M13 includes a control pole connected with the first node A, a first pole connected with the first reference signal terminal VG1, and a second pole connected with the light emission signal output Output2.

In an implementation, in the shift register element above according to embodiments of the disclosure, as illustrated in FIG. 2C and FIG. 3C, the twelfth switch transistor M12 can be a P-type transistor, the thirteenth switch transistor M13 can be an N-type transistor, and the potential of an effective pulse signal of the input signal terminal Input can be a low potential. Of course, the twelfth switch transistor can be a N-type transistor, the thirteenth switch transistor can be an P-type transistor, and at this time, the potential of an effective pulse signal of the input signal terminal can be a high potential, although embodiments of the disclosure will be limited thereto.

In an implementation, in the shift register element above according to embodiments of the disclosure, when the twelfth switch transistor is controlled by the signal of the first node to be switched on, it provides the light emission signal output terminal with the signal of the second reference signal terminal. When the thirteenth switch transistor is controlled by the signal of the first node to be switched on, it provides the light emission signal output terminal with the signal of the first reference signal terminal.

The detailed structures of the respective modules in the shift register element according to embodiments of the disclosure have been described above only by way of an example, and in an implementation, the detailed structures of the respective modules above will not be limited to the structures above according to embodiments of the disclosure, but can alternatively be other structures known to those skilled in the art, so embodiments of the disclosure will be limited thereto.

Optionally in the shift register element above according to embodiments of the disclosure, all of the switch transistors are typically switch transistors made of the same material, and in an implementation, as illustrated in FIG. 2A to FIG. 3C, all of the switch transistors can be P-type transistors, and the potential of an effective pulse signal of the input signal terminal Input can be a low potential. Of course, all of the switch transistors can alternatively be N-type transistor, and the potential of an effective pulse signal of the input signal terminal can be a high potential, although embodiments of the disclosure will not be limited thereto.

Optionally in an implementation, in the shift register element above according to embodiments of the disclosure, a P-type transistor is cut off at a high potential, and switched on at a low potential; and an N-type transistor is switched on at a high potential, and cut off at a low potential.

It shall be noted that the switch transistors as referred to in embodiments above of the disclosure can be Thin Film Transistor (TFT), or can be Metal Oxide Semiconductor (MOS), although embodiments of the disclosure will be limited thereto. In an implementation, the first poles and the second poles of these switch transistors can operate dependent upon the different types of the switch transistors and the different signals of the signal terminals so that the first poles can act as the sources or the drains of the switch transistors, and the second poles can act as the drains or the sources of the switch transistors, although embodiments of the disclosure will not be limited thereto.

An operating process of the shift register element above according to embodiments of the disclosure will be described below in connection with circuit timing diagrams taking structures of the shift register element as illustrated in FIG. 3A and FIG. 3C respectively as examples. In the following description, '1' represents a high-level signal, and '0' represents a low-level signal, where '1' and '0' represent logic levels of the shift register element, and they are only intended to better set forth the operating process of the shift register element above according to embodiments of the disclosure, but not to limit thereto the potentials to the control poles of the respective switch transistors in an implementation.

Figure 6A:
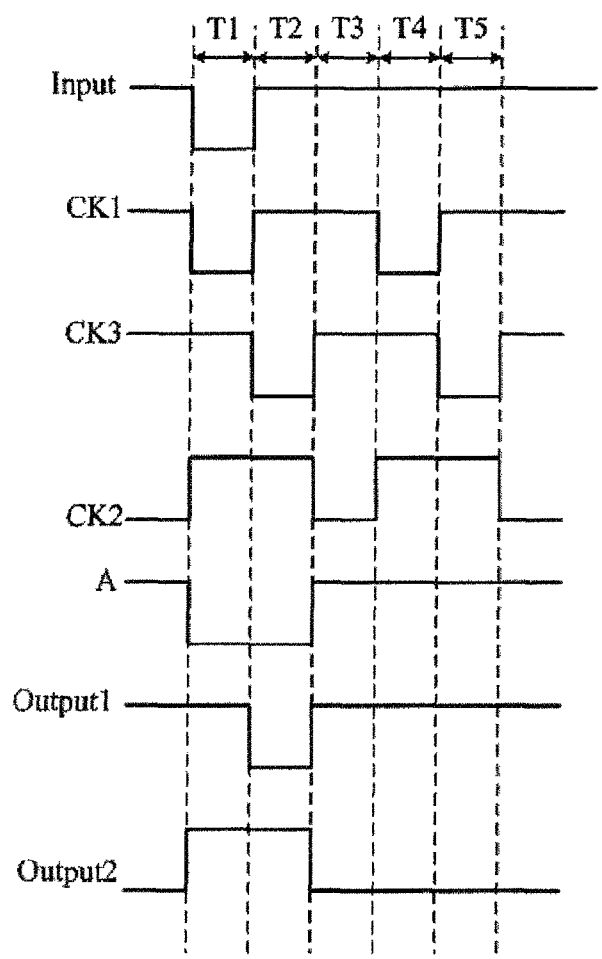
FIG. 6A is a circuit timing diagram of the shift register element illustrated in FIG. 3A.

As illustrated in FIG. 3A, all of the switch transistors in the shift register element are P-type transistors; VG1=0, and VG2=1; the first clock signal terminal CK1 and the second clock signal terminal CK2 are independent of each other; and FIG. 6A illustrates a corresponding input-output timing diagram, where three stages T1, T2, and T3 in the input-output timing diagram in FIG. 6A are illustrated.

In the stage T1, Input=0, CK1=0, CK2=1, and CK3=1.

With CK1=0, the fourteenth switch transistor M14 is switched on, and provides the first node A with the signal of the input signal terminal Input at the low potential, so the potential of the first node A is a low potential. With CK2=1, both the fourth switch transistor M4 and the fifteenth switch transistor M15 are cut off. Since the potential of the first node A is a low potential, all of the first switch transistor M1, the third switch transistor M3, and the fifth switch transistor M5 are switched on. Since the first switch transistor M1 is switched on, and provides the second node B with the signal of the second reference signal terminal VG2 at a high potential, the potential of the second node B is a high potential. Since the potential of the second node B is a high potential, both the second switch transistor M2 and the seventeenth switch transistor M17 are cut off. With VG1=0, the eighteenth switch transistor M18 is switched on, and provides the gate of the sixteenth switch transistor M16 with the signal of the first node, so the sixteenth switch transistor M16 is switched on, and provides the scan signal output terminal Output1 with the signal of the third clock signal terminal CK3 at a high potential, so the second capacitor C2 is charged, and the scan signal output terminal Output1 outputs a scan signal at a high potential. Since the third switch transistor M3 is switched on, and provides the gate of the sixth switch transistor M6 with the signal of the second reference signal terminal VG2 at a high potential, so the sixth switch transistor M6 is cut off. Since the fifth switch transistor M5 is switched on, and provides the light emission signal output terminal Output2 with the signal of the second reference signal terminal VG2 at a high potential, so the light emission signal output terminal Output2 outputs a light emission signal at a high potential.

In the stage T2, Input=1, Ck1=1, CK2=1, and CK3=0.

With CK1=1, the first switch transistor M1 is cut off, the first node A is floating, and the gate of the sixteenth switch transistor M16 is floating; and the potentials of the first node A, and the gate of the sixteenth switch transistor M16 can be maintained at low potentials due to the bootstrapping of the second capacitor C2, so the sixteenth switch transistor M16 is switched on, and provides the scan signal output terminal Output1 with the signal of the third clock signal terminal CK3 at a low potential, and the scan signal output terminal Output1 is at a low potential. Since the scan signal output terminal Output1 is at a low potential, due to the bootstrapping of the second capacitor C2, in order to maintain a stable difference in voltage across the second capacitor C2, the potential of the gate of the sixteenth switch transistor M16 is further pulled down so that the sixteenth switch transistor M16 is switched on completely, and the eighteenth switch transistor M18 is cut off due to $V_{gs}$ (M18)≥$V_{th}$ (M18), such that the gate of the sixteenth switch transistor M16 is disconnected from the drain of the fourteenth switch transistor M14, and the drain of the second switch transistor M2 to thereby avoid the potential of the gate of the sixteenth switch transistor M16 from being affected by leakage current of the fourteenth switch transistor M14, and leakage current of the second switch transistor M2. Since the sixteenth switch transistor M16 can be switched on completely to provide the scan signal output terminal Output1 with the signal of the third clock signal terminal CK3 at a low potential without any voltage loss, the scan signal output terminal Output1 outputs a scan signal at a low potential. Since the potential of the first node A is a low potential, all of the first switch transistor M1, the third switch transistor M3, and the fifth switch transistor M5 are switched on. Since the first switch transistor M1 is switched on, and provides the second node B with the signal of the second reference signal terminal VG2 at a high potential, the potential of the second node B is a high potential, and both the second switch transistor M2 and the seventeenth switch transistor M17 are cut off. Since the third switch transistor M3 is switched on, and provides the gate of the sixth switch transistor M6 with the signal of the second reference signal terminal VG2 at a high potential, the sixth switch transistor M6 is cut off. Since the fifth switch transistor M5 is switched on, and provides the light emission signal output terminal Output2 with the signal of the second reference signal terminal VG2 at a high potential, the light emission signal output terminal Output2 outputs a light emission signal at a high potential.

In the stage T3, Input=1, CK1=1, CK2=0, and CK3=1.

With CK2=0, the fourth switch transistor M4 and the fifteenth switch transistor M15 are switched on. Since the fifteenth switch transistor M15 is switched on, and provides the second node B with the signal of the first reference signal terminal VG1 at a low potential, the potential of the second node B is a low potential, the third capacitor C3 is charged, and both the second switch transistor M2 and the seventeenth switch transistor M17 are switched on. With CK1=1, the first switch transistor M1 is cut off. Since the second switch transistor M2 is switched on, and provides the first node A with the signal of the second reference signal terminal VG2 at a high potential, the potential of the first node A is a high potential, and all of the first switch transistor M1, the third switch transistor M3, and the fifth switch transistor M5 are cut off. With VG1=0, the eighteenth switch transistor M18 is switched on, and provides the gate of the sixteenth switch transistor M16 with the signal of the first node, so the sixteenth switch transistor M16 is cut off. Since the seventeenth switch transistor M17 is switched on, and provides the scan signal output terminal Output1 with the signal of the second reference signal terminal VG2 at a high potential, the scan signal output terminal Output1 outputs a scan signal at a high potential. Since the fourth switch transistor M4 is switched on, and provides the gate of the sixteenth switch transistor M6 with the signal of the first reference signal terminal VG1 at a low potential, the sixth switch transistor M6 is switched on, and provides the light emission signal output terminal Output2 with the signal of the first reference signal terminal VG1 at a low potential, so the light emission signal output terminal Output 2 outputs a light emission signal at a low potential.

Of course, a stage T4 and a stage T5 may be further included after the T3 stage, where in the stage T4, Input=1, CK1=0, CK2=1, and CK3=1.

With CK1=0, the fourteenth switch transistor M14 is switched on, and provides the first node A with the signal of the input signal terminal Input at a high potential, so the potential of the first node A is a high potential, and all of the first switch transistor M1, the third switch transistor M3, and the fifth switch transistor M5 are cut off. With VG1=0, the eighteenth switch transistor M18 is switched on, and provides the gate of the sixteenth switch transistor M16 with the signal of the first node, so the sixteenth switch transistor M16 is cut off. With CK2=1, both the fourteenth switch transistor M4 and the fifteenth switch transistor M15 are cut off. Since the fifteenth switch transistor M15 is cut off, the second node B is floating, and the potential of the second node B can be maintained at a low potential due to the bootstrapping of the third capacitor C3, so both the second switch transistor M2 and the seventeenth switch transistor M17 are switched on. Since the second switch transistor M2 is switched on, and provides the first node A with the signal of the second reference signal terminal VG2 at a high potential, the potential of the first node A can be further ensured to be a high potential. Since the seventeenth switch transistor M17 is switched on, and provides the scan signal output terminal Output1 with the signal of the second reference signal terminal VG2 at a high potential, the scan signal output terminal Output1 outputs a scan signal at a high potential. Since the fourth switch transistor M4 is cut off, the gate of the sixteenth switch transistor M6 is floating, and the gate of the sixteenth switch transistor M6 can be maintained at a low potential due to the bootstrapping of the first capacitor C1, so that the sixteen switch transistor M6 is switched on, and provides the light emission signal output terminal Output2 with the signal of the first reference signal terminal VG1, so the light emission signal output terminal Output2 outputs a light emission signal at a low potential.

In the T5 stage, Input=1, CK1=1, CK2=1, and CK3=0.

With CK2=1, both the fourth switch transistor M4 and the fifteenth switch transistor M15 are cut off. Since the fifteenth switch transistor M15 is cut off, the second node B is floating, and the potential of the second node B can be maintained at a low potential due to the bootstrapping of the third capacitor C3. With CK1=1, the fourteenth switch transistor M14 is cut off. The remaining operating process will be substantially the same as that in the T4 stage according to embodiments of the disclosure, so a repeated description thereof will be omitted here.

After the T5 stage, the operating process from the stage T3 to the stage T5 is repeated until the potential of the input signal terminal Input becomes a low potential again.

Figure 6B:
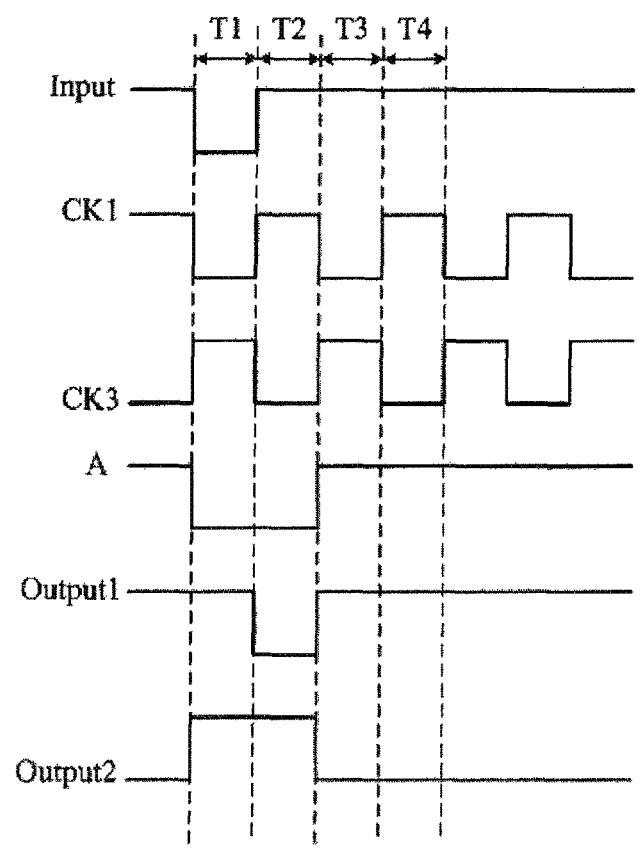
FIG. 6B is a circuit timing diagram of the shift register element illustrated in FIG. 3C.

As illustrated in FIG. 3C, all of the switch transistors in the shift register element are P-type transistors; the first clock signal terminal CK1 and the second clock signal terminal CK2 are the same signal terminal; VG1=0, and VG2=1; and FIG. 6B illustrates a corresponding input-output timing diagram, where three stages T1, T2, and T3 in the input-output timing diagram in FIG. 6B are illustrated.

In the stage T1, Input=0, CK1=0, and CK3=1.

With CK1=0, both the fourteenth switch transistor M14 and the fifteenth switch transistor M15 are switched on. Since the fourteenth switch transistor M14 is switched on, and provides the first node A with the signal of the input signal terminal Input at a low potential, so the potential of the first node A is a low potential, both the ninth switch transistor M9 and the twelfth switch transistor M12 are switched on, and the thirteenth switch transistor M13 is cut off. With VG1=0, the eighteenth switch transistor M18 is switched on, and provides the gate of the sixteenth switch transistor M16 with the signal of the first node, so the sixteenth switch transistor M16 is switched on, and provides the scan signal output terminal Output1 with the signal of the third clock signal terminal CK3 at a high potential, so the second capacitor C2 is charged, and the scan signal output terminal Output1 outputs a scan signal at a high potential. Since the fifteenth switch transistor M15 is switched on, and provides the second node B with the signal of the first reference signal terminal VG1 at a low potential, the potential of the second node B is a low potential, and both the tenth switch transistor M10 and the seventeenth switch transistor M17 are switched on. With CK3=1, the eleventh switch transistor M11 is cut off. Since the seventh switch transistor M17 is switched on, and provides the scan signal output terminal Output1 with the signal of the second reference signal terminal VG2 at a high potential, the scan signal output terminal Output1 is further ensured to output a scan signal at a high potential. Since the twelfth switch transistor M12 is switched on, and provides the light emission signal output terminal Output2 with the signal of the second reference signal terminal VG2 at a high potential, the light emission signal output terminal Output2 outputs a light emission signal at a high potential.

In the stage T2, Input=1, CK1=1, and CK3=0.

With CK1=1, the first switch transistor M1 is cut off, the first node A is floating, and the gate of the sixteenth switch transistor M16 is floating; and the potentials of the first node A, and the gate of the sixteenth switch transistor M16 are low potentials due to the bootstrapping of the second capacitor C2, so the sixteenth switch transistor M16 is switched on, and provides the scan signal output terminal Output1 with the signal of the third clock signal terminal CK3 at a low potential, so the scan signal output terminal Output1 is at a low potential. Since the scan signal output terminal Output1 is at a low potential, in order to maintain a stable difference in voltage across the second capacitor C2 due to the bootstrapping of the second capacitor C2, the potential of the gate of the sixteenth switch transistor M16 is further pulled down so that the sixteenth switch transistor M16 is switched on completely, and the eighteenth switch transistor M18 is cut off due to $V_{gs}$ (M18)≥$V_{th}$ (M18), such that the gate of the sixteenth switch transistor M16 is disconnected from the drain of the fourteenth switch transistor M14 to thereby avoid the potential of the gate of the sixteenth switch transistor M16 from being affected by leakage current of the fourteenth switch transistor M14. Since the sixteenth switch transistor M16 can be switched on completely to provide the scan signal output terminal Output1 with the signal of the third clock signal terminal CK3 at a low potential without any voltage loss, the scan signal output terminal Output1 outputs a scan signal at a low potential. Since the potential of the first node A is a low potential, both the switch transistor M9 and the twelfth switch transistor M12 are switched on, and the thirteenth switch transistor M13 is cut off. Since the ninth switch transistor M9 is switched on, and provides the second node B with the signal of the first clock signal terminal CK1 at a high potential, the potential of the second node B is a high potential, and both the tenth switch transistor M10 and the seventeenth switch transistor M17 are cut off. Since the twelfth switch transistor M12 is switched on, and provides the light emission signal output terminal Output2 with the signal of the second reference signal terminal VG2 at a high potential, the light emission signal output terminal Output2 outputs a light emission signal at a high potential.

In the stage T3, Input=1, CK1=0, and CK3=1.

With CK1=0, both the fourteenth switch transistor M14 and the fifth switch transistor M15 are switched on. Since the fourteenth switch transistor M14 is switched on, and provides the first node A with the signal of the input signal terminal Input at a high potential, the potential of the first node A is a high potential, both the ninth switch transistor M9 and the twelfth switch transistor M12 are cut off, and the thirteenth switch transistor M13 is switched on. Since the thirteenth switch transistor M13 is switched on, and provides the light emission signal output terminal Output2 with the signal of the first reference signal terminal VG1 at a low potential, the light emission signal output terminal Output2 outputs a light emission signal at a high potential. Since the fifth switch transistor M5 is switched on, and provides the second node B with the signal of the first reference signal terminal VG1 at a low potential, the potential of the second node B is a low potential, so the third capacitor C3 is charged, and both the tenth switch transistor M10 and the seventeenth switch transistor M17 are switched on. With CK3=1, the eleventh switch transistor M11 is cut off. With VG1=0, the eighteenth switch transistor M18 is switched on, and provides the gate of the sixteenth switch transistor M16 with the signal of the first node, so the sixteenth switch transistor M16 is cut off. Since the seventeenth switch transistor M17 is switched on, and provides the scan signal output terminal Output1 with the signal of the second reference signal terminal VG2 at a high potential, the scan signal output terminal Output1 outputs a scan signal at a high potential.

A stage T4 may be further included after the T3 stage, where in the stage T4, Input=1, CK1=1, and CK3=0.

With CK1=1, both the fourteenth switch transistor M14 and the fifteenth switch transistor M15 are cut off. Since the fifteenth switch transistor M15 is cut off, the second node B is floating, and the potential of the second node B can be maintained at a low potential due to the bootstrapping of the third capacitor C3, so both the tenth switch transistor M10 and the seventeenth switch transistor M17 are switched on. With CK3=0, the eleventh switch transistor M11 is switched on, and since the tenth switch transistor M10 is switched on, it can provide the first node A with the signal of the second reference signal terminal VG2 at a high potential, so that the potential of the first node A is a high potential, both the ninth switch transistor M9 and the twelfth switch transistor M12 are cut off, and the thirteenth switch transistor M13 is switched on. Since the thirteenth switch transistor M13 is switched on, and provides the light emission signal output terminal Output2 with the signal of the first reference signal terminal VG1 at a low potential, the light emission signal output terminal Output2 outputs a light emission signal at a high potential. With VG1=0, the eighteenth switch transistor M18 is switched on, and provides the gate of the sixteenth switch transistor M16 with the signal of the first node, so the sixteenth switch transistor M16 is cut off. Since the seventh switch transistor M17 is switched on, and provides the scan signal output terminal Output1 with the signal of the second reference signal terminal VG2 at a high potential, the scan signal output terminal Output1 outputs a scan signal at a high potential.

After the stage T4, the operating process in the stage T3 and the stage T4 is repeated until the potential of the input signal terminal Input becomes a low potential again.

The respective structures above in the shift register element according to embodiments of the disclosure can cooperate with each other to output simultaneously a scan signal and a light emission signal to thereby lower the complexity of the circuit, to reduce a space to be occupied, and to facilitate a design of a display panel with a narrow border.

Figure 4A:
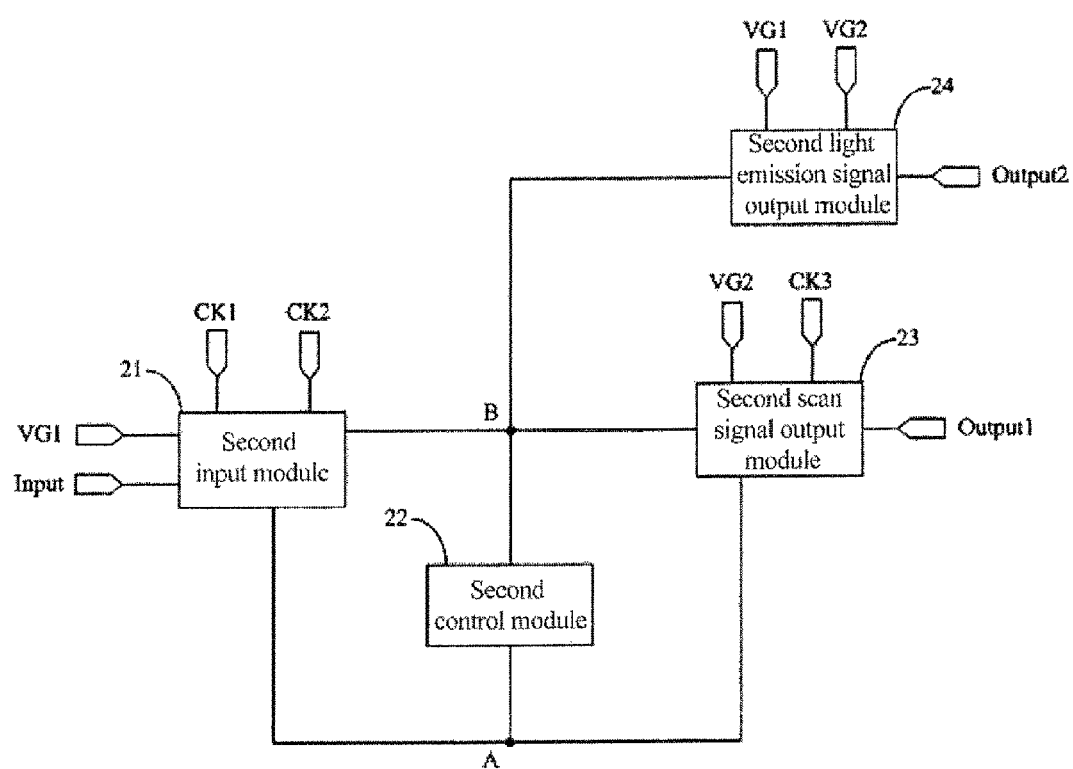
FIG. 4A is a first schematic structural diagram of a shift register element according to other embodiments of the disclosure.

Some embodiments of the disclosure provide a shift register element as illustrated in FIG. 4A including a second input module 21, a second control module 22, a second scan signal output module 23, and a second light emission signal output module.

The second input module 21 includes a first terminal connected with an input signal terminal Input, a second terminal connected with a first clock signal terminal CK1, a third terminal connected with a second clock signal terminal CK2, a fourth terminal connected with a first reference signal terminal VG1, a fifth terminal connected with a first node A, and a sixth terminal connected with a second node B; the second input module 21 is configured to be controlled by the first clock signal terminal CK1 to provide the first node A with a signal of the input signal terminal Input, and to be controlled by the second clock signal terminal CK2 to provide the second node B with a signal of the first reference signal terminal VG1.

The second control module 22 includes a first terminal connected with the first node A, and a second terminal connected with the second node B; and the second control module 22 is configured to make the potential of the signal of the first node A opposite to the potential of the signal of the second node B.

The second scan signal output module 23 includes a first terminal connected with the second reference signal terminal VG2, a second terminal connected with a third clock signal terminal CK3, a third terminal connected with the first node A, a fourth terminal connected with the second node B, and a fifth terminal connected with a scan signal output terminal Output1 of the shift register element; and the second scan signal output module 23 is configured to provide the scan signal output terminal Output1 with a signal of the third clock signal terminal CK3 when the potential of the signal of the first node A is a first potential, and to provide the scan signal output terminal Output1 with a signal of the second reference signal terminal VG2 when the potential of the signal of the second node B is the first potential; and to maintain a stable difference in voltage between the third terminal of the second scan signal output module 23, and the scan signal output terminal Output1 when the first node A is floating, and to maintain a stable difference in voltage between the second node B and the scan signal output terminal Output1 when the second node B is floating.

The second light emission signal output module 24 includes a first terminal connected with the first reference signal terminal VG1, a second terminal connected with the second reference signal terminal VG2, a third terminal connected with the second node B, and a fourth terminal connected with a light emission signal output terminal Output2 of the shift register element; and the second light emission signal output module 24 is configured to provide the light emission signal output terminal Output1 with the signal of the second reference signal terminal VG2 when the potential of the signal of the second node B is the second potential, and to provide the light emission signal output terminal Output1 with the signal of the first reference signal terminal VG1 when the potential of the signal of the second node B is the first potential.

The shift register element above according to embodiments of the disclosure includes: the second input module, the second control module, the second scan signal output module, and the second light emission signal output module, where these four modules can cooperate with each other to output simultaneously a scan signal and a light emission signal so as to lower the complexity of the circuit, to reduce a space to be occupied, and to facilitate a design of a display panel with a narrow border.

In an implementation, in the shift register element above according to embodiments of the disclosure, when the potential of an effective pulse signal of the input signal terminal is a low potential, the potential of the first reference signal terminal is a low potential, the potential of the second reference signal terminal is a high potential, the first potential is a low potential, and the second potential is a high potential; or when the potential of an effective pulse signal of the input signal terminal is a high potential, the potential of the first reference signal terminal is a high potential, the potential of the second reference signal terminal is a low potential, the first potential is a high potential, and the second potential is a low potential.

Figure 4B:
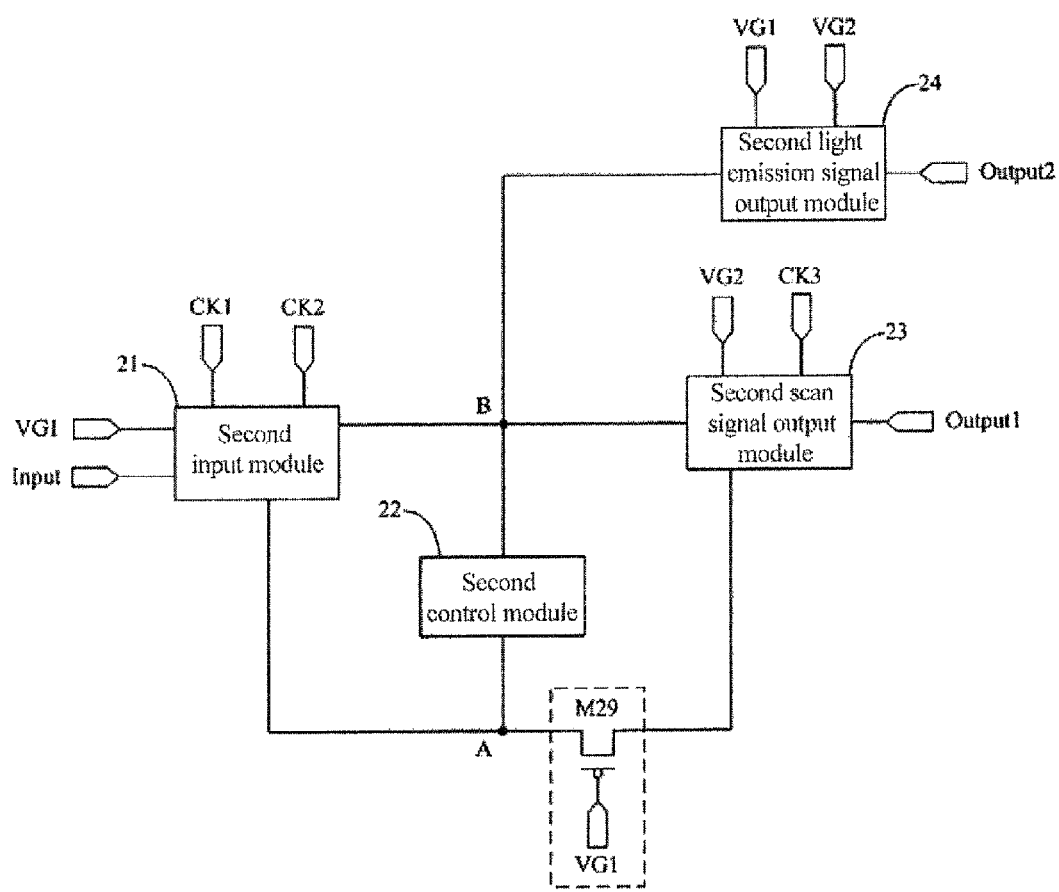
FIG. 4B is a second schematic structural diagram of the shift register element according to other embodiments of the disclosure.

Furthermore in order to enable the potential of the first node A to be stable, in an implementation, in the shift register element above according to embodiments of the disclosure, as illustrated in FIG. 4B, the shift register element can further include a twenty-ninth switch transistor M29, where the first node A is connected with the third terminal of the second scan signal output module 23 through the twenty-ninth switch transistor M29, and the twenty-ninth switch transistor M29 includes a control pole connected with the first reference signal terminal VG1, a first pole connected with the third terminal of the second scan signal output module 23, and a second pole connected with the first node A.

In an implementation, in the shift register element above according to embodiments of the disclosure, as illustrated in FIG. 4B, the twenty-ninth switch transistor M29 can be a P-type transistor, and the potential of an effective pulse signal of the input signal terminal Input can be a low potential. Of course, the twenty-ninth switch transistor can alternatively be an N-type transistor, and at this time, the potential of an effective pulse signal of the input signal terminal can be a high potential, although embodiments of the disclosure will not be limited thereto.

In an implementation, in the shift register element above according to embodiments of the disclosure, when the twenty-ninth switch transistor is controlled by the first reference signal terminal to be switched on, it provides the third terminal of the second scan signal output module with the signal of the first node. In a practical application, as illustrated in FIG. 4B, when the twenty-ninth switch transistor M29 is a P-type transistor, the twenty-ninth switch transistor M29 is switched on when a relationship between the difference in voltage Vgs (M29) of the control pole thereof and the first pole thereof, and threshold voltage thereof Vth (M29) satisfies the equation of Vgs (M29)<Vth (M29); or when the twenty-ninth switch transistor M29 is an N-type transistor, the twenty-ninth switch transistor M29 is switched on when a relationship between the difference in voltage Vgs (M29) of the control pole thereof and the first pole thereof, and threshold voltage thereof Vth (M29) satisfies the equation of Vgs (M29)>Vth (M29).

The disclosure will be described below in details in connection with embodiments thereof. It shall be noted that the embodiments will be described for the purpose of better setting forth the disclosure, but not limiting the disclosure thereto.

Figure 5A:
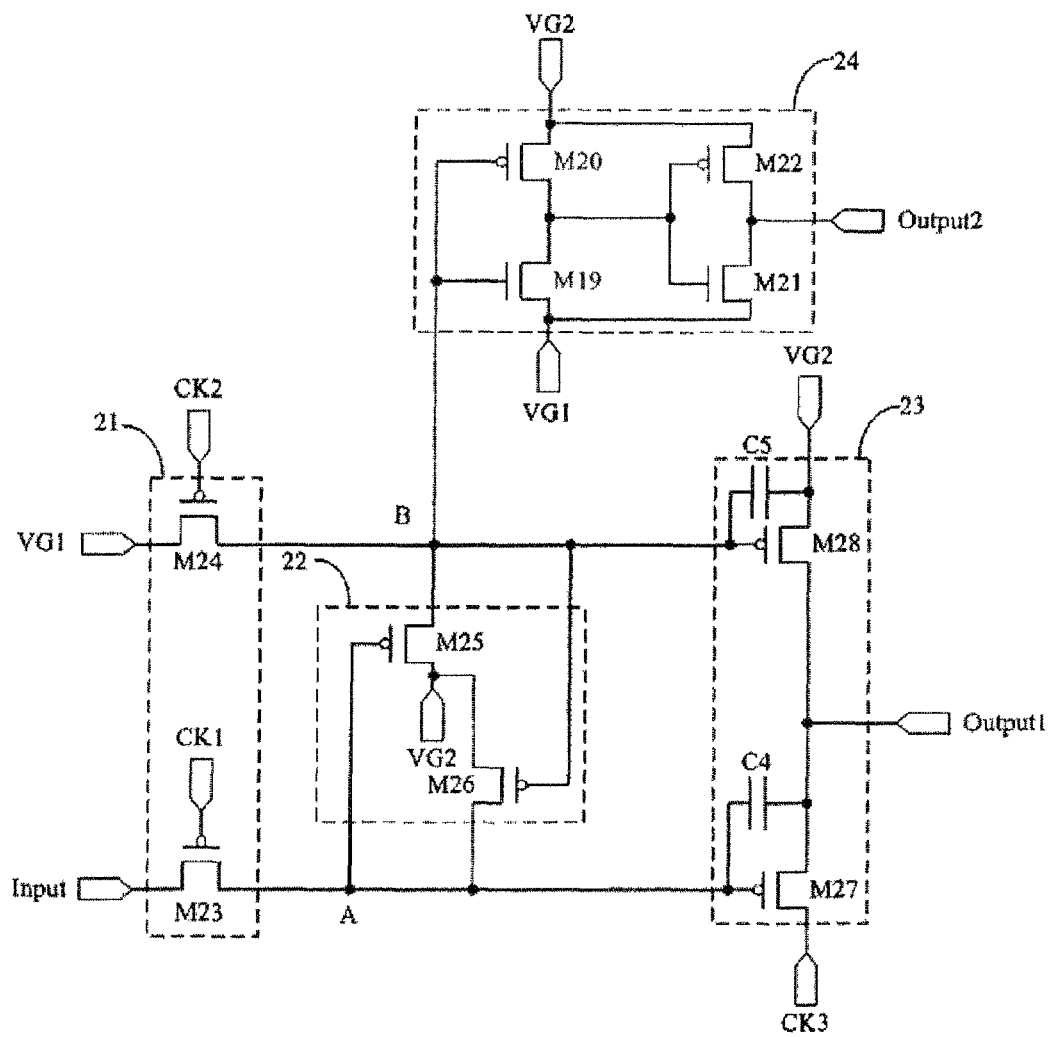
FIG. 5A is a detailed schematic structural diagram of the shift register element illustrated in FIG. 4A.
Figure 5B:
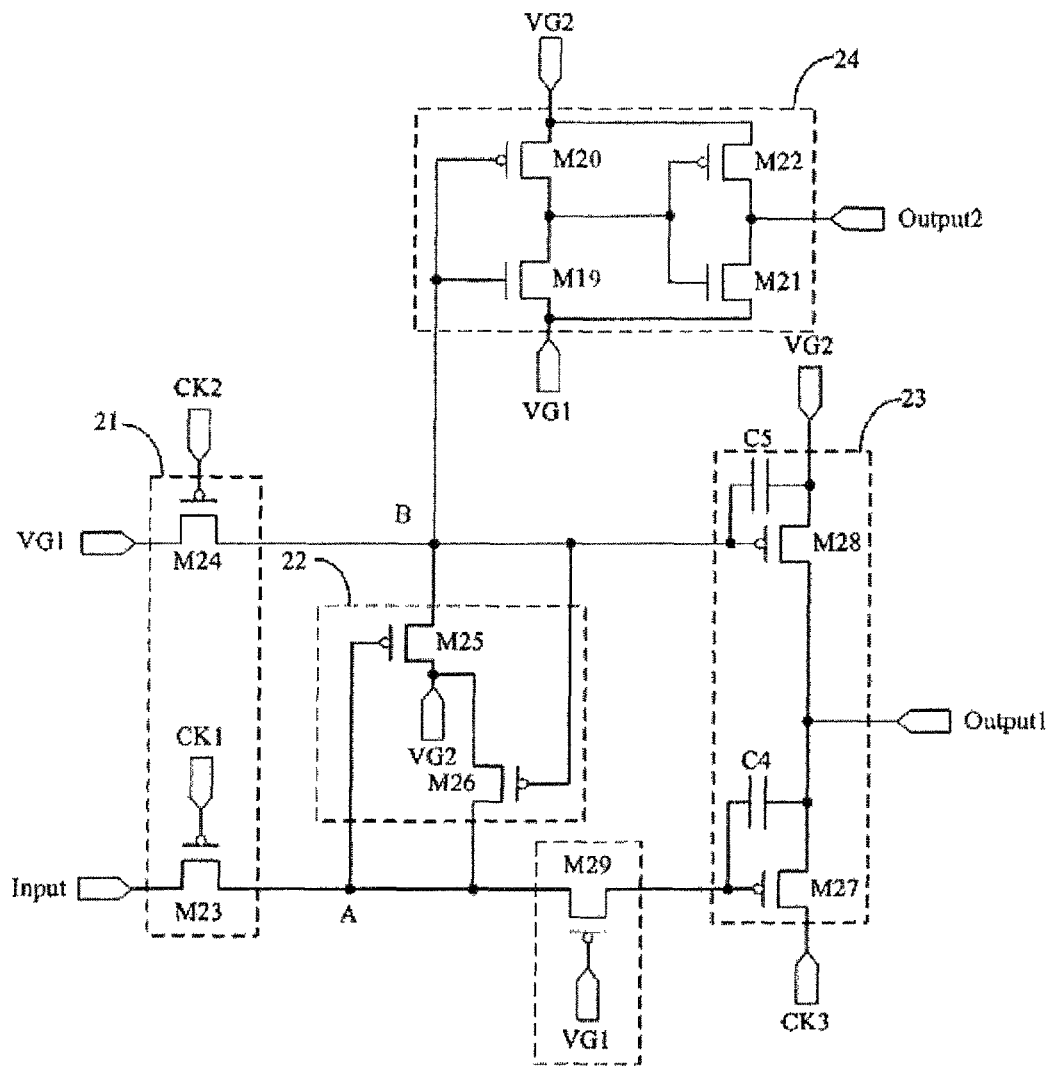
FIG. 5B is a detailed schematic structural diagram of the shift register element illustrated in FIG. 4B.

Optionally in an implementation, in the shift register element above according to embodiments of the disclosure, as illustrated in FIG. 5A and FIG. 5B, the second input module 21 can include: a twenty-third switch transistor M23 and a twenty-fourth switch transistor M24.

The twenty-third switch transistor M23 includes a control pole connected with the first clock signal terminal CK1, a first pole connected with the input signal terminal Input, and a second pole connected with the first node.

The twenty-fourth switch transistor M24 includes a control pole connected with the second clock signal terminal CK2, a first pole connected with the first reference signal terminal VG1, and a second pole connected with the second node B.

In an implementation, in the shift register element above according to embodiments of the disclosure, as illustrated in FIG. 5A and FIG. 5B, the twenty-third switch transistor M23 and the twenty-fourth switch transistor M24 can be P-type transistors, and the potential of an effective pulse signal of the input signal terminal Input can be a low potential. Of course, the twenty-third switch transistor and the twenty-fourth switch transistor can alternatively be N-type transistors, and the potential of an effective pulse signal of the input signal terminal can be a high potential, although embodiments of the disclosure will not be limited thereto.

In an implementation, in the shift register element above according to embodiments of the disclosure, when the twenty-third switch transistor is controlled by the first clock signal terminal to be switched on, it provides the first node with the signal of the input signal terminal. When the twenty-fourth switch transistor is controlled by the second clock signal terminal to be switched on, it provides the second node with the signal of the first reference signal terminal.

In an implementation, in the shift register element above according to embodiments of the disclosure, as illustrated in FIG. 5A and FIG. 5B, the second control module 22 can include: a twenty-fifth switch transistor M25 and a twenty-sixth switch transistor M26.

The twenty-fifth switch transistor M25 includes a control pole connected with the first node A, a first pole connected with the second reference signal terminal VG2, and a second pole connected with the second node B.

The twenty-sixth switch transistor M26 includes a control pole connected with the second node B, a first pole connected with the second reference signal terminal VG2, and a second pole connected with the first node A.

In an implementation, in the shift register element above according to embodiments of the disclosure, as illustrated in FIG. 5A and FIG. 5B, the twenty-fifth switch transistor M25 and the twenty-sixth switch transistor M26 can be P-type transistors, and the potential of an effective pulse signal of the input signal terminal Input can be a low potential. Of course, the twenty-fifth switch transistor and the twenty-sixth switch transistor can alternatively be N-type transistor, and the potential of an effective pulse signal of the input signal terminal can be a high potential, although embodiments of the disclosure will not be limited thereto.

In an implementation, in the shift register element above according to embodiments of the disclosure, when the twenty-fifth switch transistor is controlled by the signal of the first node to be switched on, it provides the second node with the signal of the second reference signal terminal at a high potential. When the twenty-sixth switch transistor is controlled by the signal of the second node to be switched on, it provides the first node with the signal of the second reference signal terminal at a high potential.

Optionally in an implementation, in the shift register element above according to embodiments of the disclosure, as illustrated in FIG. 5A and FIG. 5B, the second scan signal output module 23 can include: a twenty-seventh switch transistor M27, a twenty-eighth switch transistor M28, a fourth capacitor C4, and a fifth capacitor C5.

The twenty-seventh switch transistor M27 includes a control pole connected with the third terminal of the second scan signal output module 23, a first pole connected with the third clock signal terminal CK3, and a second pole connected with the scan signal output terminal Output1.

The twenty-eighth switch transistor M28 includes a control pole connected with the second node B, a first pole connected with the second reference signal terminal VG2, and a second pole connected with the scan signal output terminal Output1.

The fourth capacitor C4 is connected between the control pole of the twenty-seventh switch transistor M27, and the scan signal output terminal Output1.

The fifth capacitor C5 is connected between the second node B and the scan signal output terminal Output1.

In an implementation, in the shift register element above according to embodiments of the disclosure, as illustrated in FIG. 5A and FIG. 5B, the twenty-seventh switch transistor M27 and the twenty-eighth switch transistor M28 can be P-type transistors, and the potential of an effective pulse signal of the input signal terminal Input can be a low potential. Of course, the twenty-seventh switch transistor and the twenty-eighth switch transistor can alternatively be N-type transistors, and the potential of an effective pulse signal of the input signal terminal Input can be a high potential, although embodiments of the disclosure will not be limited thereto.

In an implementation, in the shift register element above according to embodiments of the disclosure, when the twenty-seventh switch transistor is controlled by the signal of the control pole thereof to be switched on, it provides the scan signal output terminal with the signal of the third clock signal terminal. When the twenty-eighth switch transistor is controlled by the signal of the second node to be switched on, it provides the scan signal output terminal with the signal of the second reference signal terminal. When the first node is floating, a stable difference in voltage between the control pole of the twenty-seventh switch transistor and the scan signal output terminal may be maintained due to bootstrapping of the fourth capacitor. When the second node floating, a stable difference in voltage between the second node and the scan signal output terminal may be maintained due to bootstrapping of the fifth capacitor.

In an implementation, in the shift register element above according to embodiments of the disclosure, as illustrated in FIG. 5A and FIG. 5B, the second light emission signal output module 24 can include: a nineteenth switch transistor M19, a twentieth switch transistor M20, a twenty-first switch transistor M21, and a twenty-second switch transistor M22.

The nineteenth switch transistor M19 includes a control pole connected with the second node B, a first pole connected with the first reference signal terminal VG1, and a second pole connected respectively with a control pole of the twenty-first switch transistor M21, and a control pole of the twenty-second switch transistor M22.

The twentieth switch transistor M20 includes a control pole connected with the second node B, a first pole connected with the second reference signal terminal VG2, and a second pole connected respectively with the control pole of the twenty-first switch transistor M21, and the control pole of the twenty-second switch transistor M22.

The twenty-first switch transistor M21 includes a first pole connected with the first reference signal terminal VG1, and a second pole connected with the light emission signal output terminal Output2.

The twenty-second switch transistor M22 includes a first pole connected with the second reference signal terminal VG2, and a second pole connected with the light emission signal output terminal Output2.

In an implementation, in the shift register element above according to embodiments of the disclosure, as illustrated in FIG. 5A and FIG. 5B, the nineteenth switch transistor M19 and the twenty-first switch transistor M21 can be N-type transistors, the twentieth switch transistor M20 and the twenty-second switch transistor M22 can be P-type transistors, and the potential of an effective pulse signal of the input signal terminal Input can be a low potential. Of course, the nineteenth switch transistor and the twenty-first switch transistor can be P-type transistors, the twentieth switch transistor M20 and the twenty-second switch transistor M22 can be N-type transistors, and the potential of an effective pulse signal of the input signal terminal can be a high potential, although embodiments of the disclosure will not be limited thereto.

In an implementation, in the shift register element above according to embodiments of the disclosure, when the nineteenth switch transistor is controlled by the signal of the second node to be switched on, it provides the control pole of the twenty-first switch transistor, and the control pole of the twenty-second switch transistor respectively with the signal of the first reference signal terminal. When the twentieth switch transistor is controlled by the signal of the second node to be switched on, it provides the control pole of the twenty-first switch transistor, and the control pole of the twenty-second switch transistor respectively with the signal of the second reference signal terminal. When the twenty-first switch transistor is controlled by the signal of the control pole thereof to be switched on, it provides the light emission signal output terminal with the signal of the first reference signal terminal. When the twenty-second switch transistor is controlled by the signal of the control pole thereof to be switched on, it provides the light emission signal output terminal with the signal of the second reference signal terminal.

The detailed structures of the respective modules in the shift register element according to embodiments of the disclosure have been described above only by way of an example, and in an implementation, the detailed structures of the respective modules above will not be limited to the structures above according to embodiments of the disclosure, but can alternatively be other structures known to those skilled in the art, so embodiments of the disclosure will be limited thereto.

Optionally in the shift register element above according to embodiments of the disclosure, all of the switch transistors are typically switch transistors made of the same material, and in an implementation, as illustrated in FIG. 5A and FIG. 5B, all of the switch transistors can be P-type transistors, and the potential of an effective pulse signal of the input signal terminal Input can be a low potential. Of course, all of the switch transistors can alternatively be N-type transistor, and the potential of an effective pulse signal of the input signal terminal can be a high potential, although embodiments of the disclosure will not be limited thereto.

Optionally in an implementation, a P-type transistor is cut off at a high potential, and switched on at a low potential; and an N-type transistor is switched on at a high potential, and cut off at a low potential.

It shall be noted that the switch transistors as referred to in embodiments above of the disclosure can be Thin Film Transistor (TFT), or can be Metal Oxide Semiconductor (MOS), although embodiments of the disclosure will be limited thereto. In an implementation, the first poles and the second poles of these switch transistors can operate dependent upon the different types of the switch transistors, and the different signals of the signal ends so that the first poles can act as the sources or the drains of the switch transistors, and the second poles can act as the drains or the sources of the switch transistors, although embodiments of the disclosure will not be limited thereto.

Figure 6C:
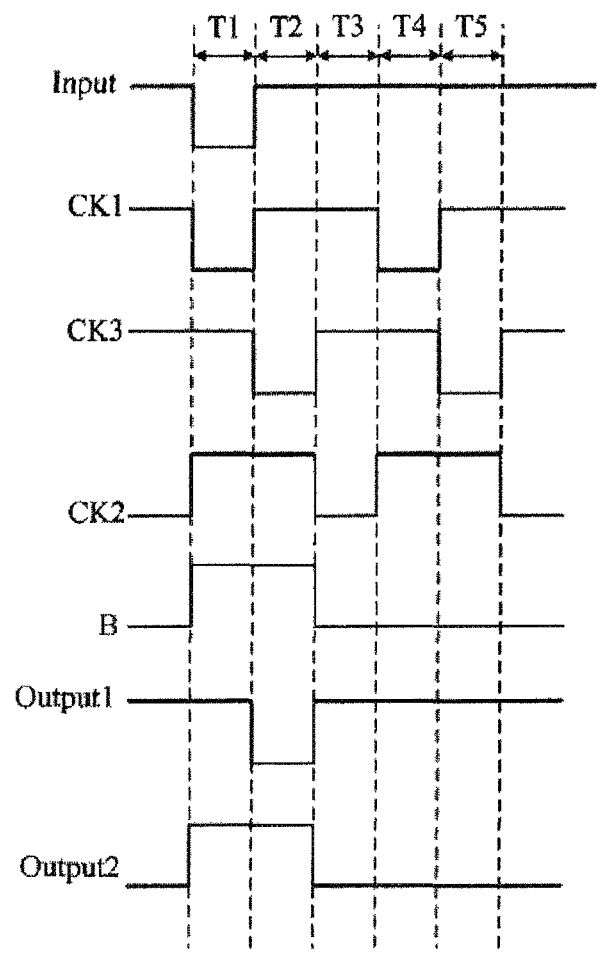
FIG. 6C is a circuit timing diagram of the shift register element illustrated in FIG. 5B.

As illustrated in FIG. 5B, all of the switch transistors in the shift register element are P-type transistors; VG1=0, and VG2=1; and FIG. 6C illustrates a corresponding input-output timing diagram, where three stages T1, T2, and T3 in the input-output timing diagram in FIG. 6C are illustrated.

In the stage T1, Input=0, CK1=0, CK2=1, and CK3=1.

With CK2=1, the twenty-fourth switch transistor M24 is cut off. With CK1=0, the twenty-third switch transistor M23 is switched on, and provides the first node A with the signal of the input signal terminal Input at a low potential, so the potential of the first node A is a low potential, and the twenty-fifth switch transistor M25 is switched on, and provides the second node B with the signal of the second reference signal terminal VG2 at a high potential, so the potential of the second node B is a high potential, and all of the twentieth switch transistor M20, the twenty-sixth switch transistor M26, and the twenty-eighth switch transistor M28 are cut off, and the nineteenth switch transistor M19 is switched on. Since the nineteenth switch transistor M19 is switched on, and provides the gates of the twenty-first switch transistor M21 and the twenty-second switch transistor M22 with the signal of the first reference signal terminal VG1 at a low potential, so that the twenty-first switch transistor M21 is cut off, and the twenty-second switch transistor M22 is switched on. Since the twenty-second switch transistor M22 is switched on, and provides the light emission signal output terminal Output2 with the signal of the second reference signal terminal VG2 at a high potential, the light emission signal output terminal Output2 outputs a light emission signal at a high potential. With VG1=0, the twenty-ninth switch transistor M29 is switched on, and provides the gate of the twenty-seventh switch transistor M27 with the signal of the first node, the twenty-seventh switch transistor M27 is switched on, and provides the light emission signal output terminal Output1 with the signal of the third clock signal CK3 at a high potential, so the fourth capacitor C4 is charged, and the light emission signal output terminal Output1 outputs a scan signal at a high potential.

In the stage T2, Input=1, CK1=1, CK2=1, and CK3=0.

With CK1=1, the twenty-third switch transistor M23 is cut off, the first node A is floating, and the gate of the twenty-seventh switch transistor M27 is floating; and the potentials of the first node A, and the gate of the twenty-seventh switch transistor M27 can be maintained as low potentials due to the bootstrapping of the fourth capacitor C4, so the twenty-seventh switch transistor M27 is switched on, and provides the light emission signal output terminal Output1 with the signal of the third clock signal terminal CK3 at a low potential, so the light emission signal output terminal Output1 is at a low potential. Since the light emission signal output terminal Output1 is at a low potential, in order to maintain a stable difference in voltage across the fourth capacitor C4 due to the bootstrapping of the fourth capacitor C4, the potential of the gate of the twenty-seventh switch transistor M27 is further pull down so that the twenty-seventh switch transistor M27 is switched on completely, and the twenty-ninth switch transistor M29 is cut off due to Vgs (M29)≥Vth (M29), such that the gate of the twenty-seventh switch transistor M27 is disconnected from the drain of the twenty-third switch transistor M23, and the drain of the twenty-sixth switch transistor M26 to thereby avoid the potential of the gate of the twenty-seventh switch transistor M27 from being affected by leakage current of the twenty-third switch transistor M23, and leakage current of the twenty-sixth switch transistor M26. Since the twenty-seventh switch transistor M27 can be switched on completely to provide the scan signal output terminal Output1 with the signal of the third clock signal terminal CK3 at a low potential without any voltage loss, so that the scan signal output terminal Output1 outputs a scan signal at a low potential. Since the potential of the first node A is a low potential, the twenty-fifth switch transistor M25 is switched on, and provides the second node B with the signal of the second reference signal terminal VG2 at a high potential, the potential of the second node B is a high potential, all of the twentieth switch transistor M20, the twenty-sixth switch transistor M26, and the twenty-eighth switch transistor M28 are cut off, and the nineteenth switch transistor M19 is switched on. Since the nineteenth switch transistor M19 is switched on, and provides the gates of the twenty-first switch transistor M21 and the twenty-second switch transistor M22 with the signal of the first reference signal terminal VG1 at a low potential, the twenty-first switch transistor M21 is cut off, and the twenty-second switch transistor M22 is switched on. Since the twenty-second switch transistor M22 is switched on, and provides the light emission signal output terminal Output2 with the signal of the second reference signal terminal VG2 at a high potential, so the light emission signal output terminal Output2 outputs a light emission signal at a high potential.

In the stage T3, Input=1, CK1=1, CK2=0, and CK3=1.

With CK2=0, the twenty-fourth switch transistor M24 is switched on, and provides the second node B with the signal of the first reference signal terminal VG1 at a low potential, so the potential of the second node B is a low potential, the fifth capacitor C5 is charged, all of the twentieth switch transistor M20, the twenty-sixth switch transistor M26, and the twenty-eighth switch transistor M28 are switched on, and the nineteenth switch transistor M19 is cut off. Since the twentieth switch transistor M20 is switched on, and provides the gates of the twenty-first switch transistor M21 and the twenty-second switch transistor M22 with the signal of the second reference signal terminal VG2 at a high potential, the twenty-first switch transistor M21 is switched on, and the twenty-second switch transistor M22 is cut off. Since the twenty-first switch transistor M21 is switched on, and provides the light emission signal output terminal Output2 with the signal of the first reference signal terminal VG2 at a low potential, so the light emission signal output terminal Output2 outputs a light emission signal at a low potential. Since the twenty-sixth switch transistor M26 is switched on, and provides the first node A with the signal of the second reference signal terminal VG2 at a high potential, the potential of the first node A is a high potential, and the twenty-fifth switch transistor M25 is cut off. With VG1=0, the twenty-ninth switch transistor M29 is switched on, and provides the gate of the twenty-seventh switch transistor M27 with the signal of the first node A, so the twenty-seventh switch transistor M27 is cut off. Since the twenty-eighth switch transistor M28 is switched on, and provides the scan signal output terminal Output1 with the signal of the second reference signal terminal VG2 at a high potential, the scan signal output terminal Output1 outputs a scan signal at a high potential.

Of course, a stage T4 and a stage T5 can be further included after the stage T3, where in the stage T4, Input=1, CK1=0, CK2=1, and CK3=1.

With CK1=0, the twenty-third switch transistor M23 is switched on, and provides the first node A with the signal of the input signal terminal Input at a high potential, so the potential of the first node is a high potential, and the twenty-fifth switch transistor M25 is cut off. With VG1=0, the twenty-ninth switch transistor M29 is switched on, and provides the gate of the twenty-seventh switch transistor M27 with the signal of the first node A, so the twenty-seventh switch transistor M27 is cut off. With CK2=1, the twenty-fourth switch transistor M24 is cut off, the second node B is floating, and the potential of the second node B can be maintained as a low potential due to the bootstrapping of the fifth capacitor C5, so all of the twentieth switch transistor M20, the twenty-sixth switch transistor M26, and the twenty-eighth switch transistor M28 are switched on. Since the twenty-sixth switch transistor M26 is switched on, and provides the first node A with the signal of the second reference signal terminal VG2 at a high potential, the potential of the first node A is further ensured to be a high potential. Since the twenty-eighth switch transistor M28 is switched on, and provides the scan signal output terminal Output1 with the signal of the second reference signal terminal VG2 at a high potential, the scan signal output terminal Output1 outputs a scan signal at a high potential. Since the twentieth switch transistor M20 is switched on, and provides the gates of the twenty-first switch transistor M21 and the twenty-second switch transistor M22 with the signal of the second reference signal terminal VG2 at a high potential, the twenty-first switch transistor M21 is switched on, and the twenty-second switch transistor M22 is cut off. Since the twenty-first switch transistor M21 is switched on, and provides the light emission signal output terminal Output2 with the signal of the first reference signal terminal VG1 at a low potential, the light emission signal output terminal Output2 outputs a light emission signal at a high potential.

In the stage T5, Input=1, CK1=1, CK2=1, and CK3=0.

With CK2=1, the twenty-fourth switch transistor M24 is cut off, the second node B is floating, and the potential of the second node B can be maintained as a low potential due to the bootstrapping of the fifth capacitor C5. With CK1=1, the twenty-third switch transistor M23 is cut off. The remaining operating process will be substantially the same as that in the stage T4 according to embodiments, so a repeated description thereof will be omitted here.

The operating process from the stage T3 to the stage T5 will be repeated after the stage T5 until the potential of the input signal terminal Input becomes a low potential again.

The respective structures above in the shift register element according to the embodiments of the disclosure can cooperate with each other to output simultaneously a scan signal and a light emission signal to thereby lower the complexity of the circuit, to reduce a space to be occupied, and to facilitate a design of a display panel with a narrow border.

Figure 7A:
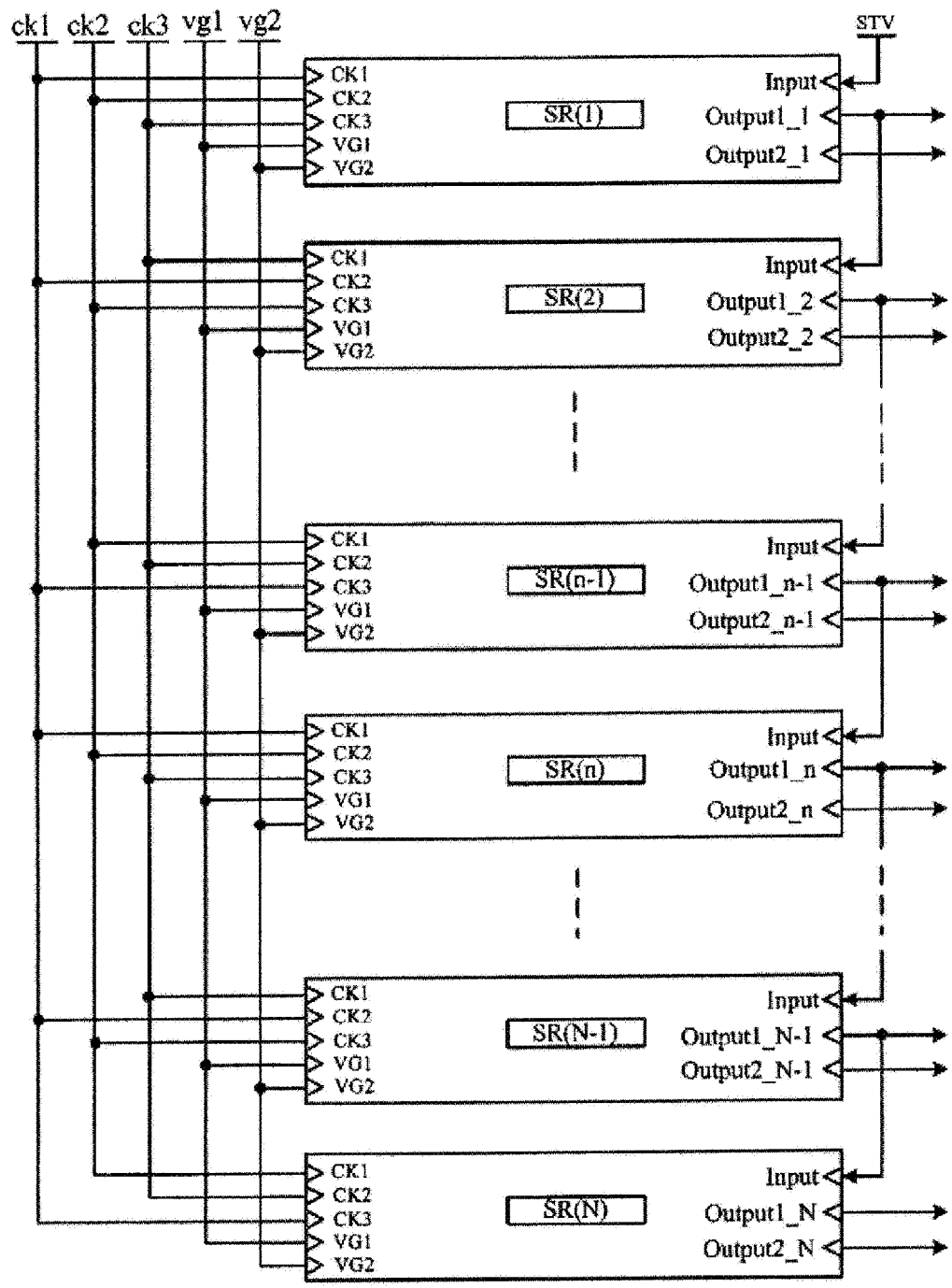
FIG. 7A is a first schematic structural diagram of a gate driver circuit according to some embodiments of the disclosure.
Figure 7B:
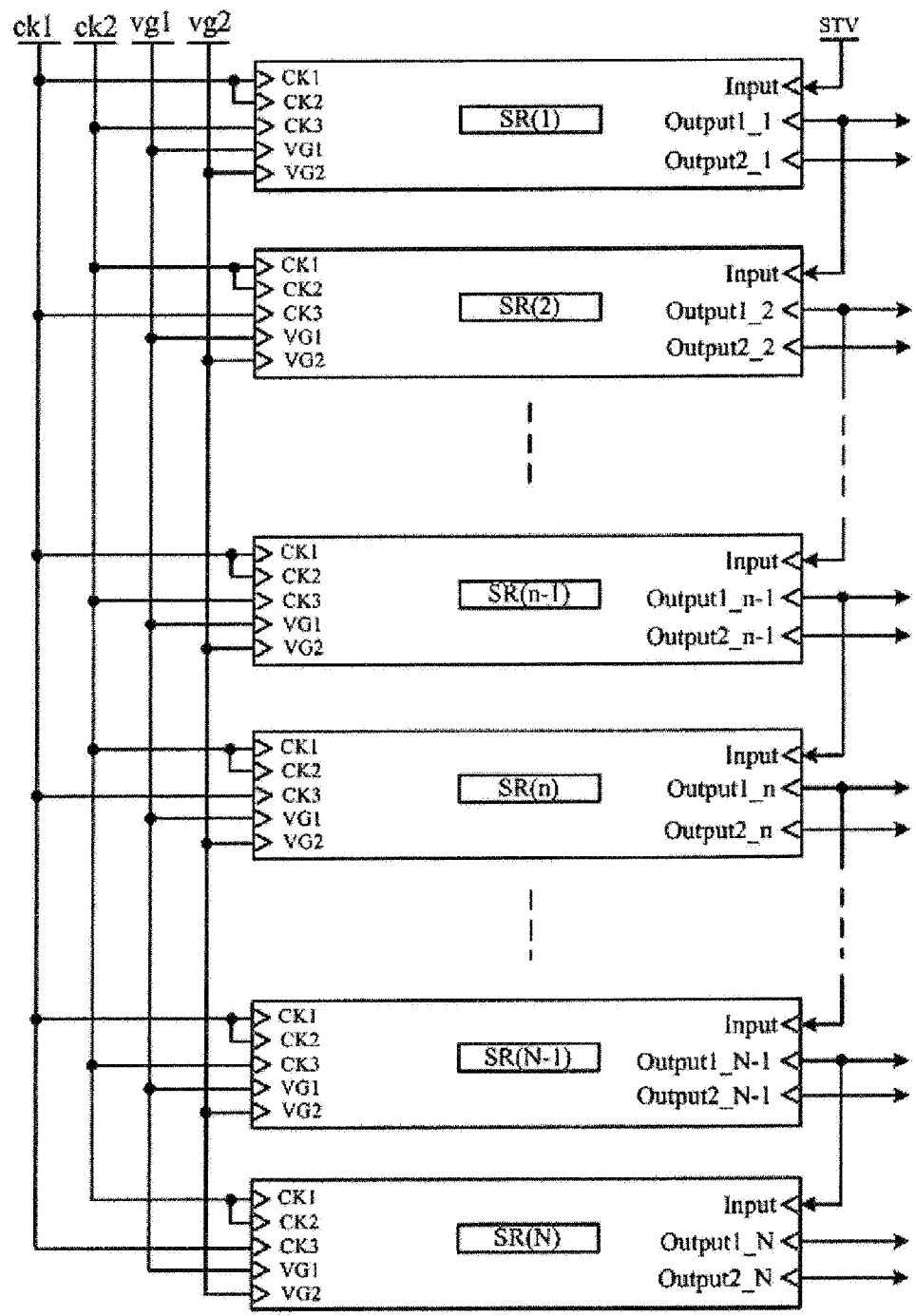
FIG. 7B is a second schematic structural diagram of a gate driver circuit according to some embodiments of the disclosure.

Based upon the same inventive idea, some embodiments of the disclosure further provide a gate driver circuit as illustrated in FIG. 7A and FIG. 7B including a plurality of shift register elements above according to embodiments of the disclosure, SR(1), SR(2), SR(n−1), SR(n), . . . , SR(N−1), and SR(N) (N shift register elements in total, where 1≤n≤N), which are concentrated.

The input signal terminal Input of the first level of shift register element SR(1) is connected with a frame trigger signal terminal STV.

The input signal terminals Input of the other levels of shift register elements SR(n) are connected respectively with the scan signal output terminals Output1 of the preceding levels of shift register elements SR(n−1), except for the first level of shift register element SR(1). Optionally the detailed structure of each shift register element in the gate driver circuit above will be functionally and structurally the same as that of the shift register elements, so a repeated description thereof will be omitted here. The gate driver circuit can be applicable to an organic electroluminescent display panel, although embodiments of the disclosure will not be limited thereto.

Optionally in the gate driver circuit above according to embodiments of the disclosure, when the first clock signal terminal CK1 and the second clock signal terminal CK2 are independent of each other, as illustrated in FIG. 7A, all of the first clock signal terminal CK1 of the (3k−2)-th level of shift register element, the second clock signal terminal CK2 of the (3k−1)-th level of shift register element, and the third clock signal terminal CK3 of the 3k-th level of shift register element are connected with the same clock terminal, i.e., a first clock terminal ck1; all of the second clock signal terminal CK2 of the (3k−2)-th level of shift register element, the third clock signal terminal CK3 of the (3k−1)-th level of shift register element, and the first clock signal terminal CK1 of the 3k-th level of shift register element are connected with the same clock terminal, i.e., a second clock terminal ck2; and all of the third clock signal terminal CK3 of the (3k−2)-th level of shift register element, the first clock signal terminal CK1 of the (3k−1)-th level of shift register element, and the second clock signal terminal CK2 of the 3k-th level of shift register element are connected with the same clock terminal, i.e., a third clock terminal ck3; where k is a positive integer.

Optionally in the gate driver circuit above according to the embodiment of the disclosure, when the first clock signal terminal CK1 and the second clock signal terminal CK2 are the same clock signal terminal, as illustrated in FIG. 7B, both the first clock signal terminal CK1 of the (2m−1)-th level of shift register element, and the third clock signal terminal CK3 of the 2m-th level of shift register element are connected with the same clock terminal, i.e., a first clock terminal ck1; and the third clock signal terminal CK3 of the (2m−1)-th level of shift register element, and the first clock signal terminal CK of the 2m-th level of shift register element are connected with the same clock terminal, i.e., a second clock terminal ck2; where m is a positive integer.

Based upon the same inventive idea, some embodiments of the disclosure further provide an organic electroluminescent display panel including the gate driver circuit above according to embodiments of the disclosure, and a plurality of signal line groups including gate lines and light emission signal lines.

Each signal line group corresponds to one of the shift register element in the gate driver circuit.

The gate lines in the same signal line group are connected with the scan signal output terminals of the corresponding shift register elements, and the light emission signal lines are connected with the light emission signal output terminals of the corresponding shift register elements. The display device can address the problem under a similar principle to the shift register elements above, so reference can be made to the implementations of the shift register elements above for an implementation of the display device, so a repeated description thereof will be omitted here.

In an implementation, the organic electroluminescent display panel above according to embodiments of the disclosure can be a mobile phone, a tablet computer, a TV set, a display, a notebook computer, a digital photo frame, a navigator, or any other product or component capable of displaying. All of other components indispensable to the organic electroluminescent display panel shall be appreciated by those ordinarily skilled in the art, so a repeated description thereof will be omitted here, and embodiments of the disclosure will not be limited thereto.

In the shift register element, the gate driver circuit, and the organic electroluminescent display panel according to embodiments of the disclosure, the shift register element includes: the first input module, the first control module, the first scan signal output module, and the first light emission signal output module, where these four modules can cooperate with each other to output simultaneously a scan signal and a light emission signal so as to lower the complexity of the circuit, to reduce a space to be occupied, and to facilitate a design of a display panel with a narrow border; or the shift register element includes: the second input module, the second control module, the second scan signal output module, and the second light emission signal output module, where these four modules can cooperate with each other to output simultaneously a scan signal and a light emission signal so as to lower the complexity of the circuit, to reduce a space to be occupied, and to facilitate a design of a display panel with a narrow border.

Evidently those skilled in the art can make various modifications and variations to the disclosure without departing from the spirit and scope of the disclosure. Accordingly the disclosure is also intended to encompass these modifications and variations thereto so long as the modifications and variations come into the scope of the claims appended to the disclosure and their equivalents.

The invention claimed is:

1. A shift register element, comprising: a first input module, a first control module, a first scan signal output module, and a first light emission signal output module, wherein:
   the first input module comprises a first terminal connected with an input signal terminal, a second terminal connected with a first clock signal terminal, a third terminal connected with a second clock signal terminal, a fourth terminal connected with a first reference signal terminal, a fifth terminal connected with a first node, and a sixth terminal connected with a second node; and the first input module is configured to be controlled by the first clock signal terminal to provide the first node with a signal of the input signal terminal, and to be controlled by the second clock signal terminal to provide the second node with a signal of the first reference signal terminal;
   the first control module comprises a first terminal connected with the first node, and a second terminal connected with the second node; and the first control module is configured to make a potential of the signal of the first node opposite to a potential of the signal of the second node;
   the first scan signal output module comprises a first terminal connected with a second reference signal terminal, a second terminal connected with a third clock signal terminal, a third terminal connected with the first node, a fourth terminal connected with the second node, and a fifth terminal connected with a scan signal output terminal of the shift register element; and the first scan signal output module is configured to provide the scan signal output terminal with a signal of the third clock signal terminal when the potential of the signal of the first node is a first potential, and to provide the scan signal output terminal with a signal of the second reference signal terminal when the potential of the signal of the second node is the first potential; and to maintain a stable difference in voltage between the third terminal of the first scan signal output module and the scan signal output terminal when the first node is floating, and to maintain a stable difference in voltage between the second node and the scan signal output terminal when the second node is floating; and
   the first light emission signal output module comprises a first terminal connected with the first reference signal terminal, a second terminal connected with the second reference signal terminal, a third terminal connected with the first node, and a fourth terminal connected with a light emission signal output terminal of the shift register element; and the first light emission signal output module is configured to provide the light emission signal output terminal with the signal of the second reference signal terminal if the potential of the signal of the first node is the first potential, and to provide the light emission signal output terminal with the signal of the first reference signal terminal when the potential of the signal of the first node is a second potential.

2. The shift register element according to claim 1, wherein the first clock signal terminal and the second clock signal terminal are independent of each other, and the first control module comprises: a first switch transistor and a second switch transistor, wherein:
   the first switch transistor comprises a control pole connected with the first node, a first pole connected with the second reference signal terminal, and a second pole connected with the second node; and
   the second switch transistor comprises a control pole connected with the second node, a first pole connected with the second reference signal terminal, and a second pole connected with the first node.

3. The shift register element according to claim 2, wherein the first light emission signal output module comprises: a third switch transistor, a fourth switch transistor, a fifth switch transistor, a sixth switch transistor, and a first capacitor, wherein:
   the third switch transistor comprises a control pole connected with the first node, a first pole connected with the second reference signal terminal, and a second pole connected with a control pole of the sixth switch transistor;
   the fourth switch transistor comprises a control pole connected with the second clock signal terminal, a first pole connected with the first reference signal terminal, and a second pole connected with the control pole of the sixth switch transistor;
   the fifth switch transistor comprises a control pole connected with the first node, a first pole connected with the second reference signal terminal, and a second pole connected with the light emission signal output terminal;
   the sixth switch transistor comprises a first pole connected with the first reference signal terminal, and a second pole connected with the light emission signal output terminal; and
   the first capacitor is connected between the control pole of the sixth switch transistor and the light emission signal output terminal; or
   the first light emission signal output module comprises: a seventh switch transistor and an eighth switch transistor, wherein:
   the seventh switch transistor comprises a control pole connected with the first node, a first pole connected with the second reference signal terminal, and a second pole connected with the light emission signal output terminal; and
   the eight switch transistor comprises a control pole connected with the first node, a first pole connected with the first reference signal terminal, and a second pole connected with the light emission signal output terminal.

4. The shift register element according to claim 1, wherein the first clock signal terminal and the second clock signal terminal are a same signal terminal, and the first control module comprises: a ninth switch transistor, a tenth switch transistor, and an eleventh switch transistor, wherein:
   the ninth switch transistor comprises a control pole connected with the first node, a first pole connected with the first clock signal terminal, and a second pole connected with the second node;
   the tenth switch transistor comprises a control pole connected with the second node, a first pole connected with the second reference signal terminal, and a second pole connected with the first pole of the eleventh switch transistor; and the eleventh switch transistor comprises a control pole connected with the third clock signal terminal, and a second pole connected with the first node.

5. The shift register element according to claim 4, wherein the first light emission signal output module comprises: a twelfth switch transistor and a thirteenth switch transistor, wherein:

the twelfth switch transistor comprises a control pole connected with the first node, a first pole connected with the second reference signal terminal, and a second pole connected with the light emission signal output terminal; and the thirteenth switch transistor comprises a control pole connected with the first node, a first pole connected with the first reference signal terminal, and a second pole connected with the light emission signal output.

6. The shift register element according to claim 1, wherein the first input module comprises: a fourteenth switch transistor and a fifteenth switch transistor, wherein:

the fourteenth switch transistor comprises a control pole connected with the first clock signal terminal, a first pole connected with the input signal terminal, and a second pole connected with the first node; and the fifteenth switch transistor comprises a control pole connected with the second clock signal terminal, a first pole connected with the first reference signal terminal, and a second pole connected with the second node.

7. The shift register element according to claim 1, wherein the first scan signal output module comprises: a sixteenth switch transistor, a seventeenth switch transistor, a second capacitor, and a third capacitor, wherein:

the sixteenth switch transistor comprises a control pole which is the third terminal of the first scan signal output module, a first pole connected with the third clock signal terminal, and a second pole connected with the scan signal output terminal;

the seventeenth switch transistor comprises a control pole connected with the second node, a first pole connected with the second reference signal terminal, and a second pole connected with the scan signal output terminal;

the second capacitor is connected between the control pole of the sixteenth switch transistor, and the scan signal output terminal; and the third capacitor is connected between the second node and the scan signal output terminal.

8. The shift register element according to claim 1, further comprising: an eighteenth switch transistor, wherein the first node is connected with the third terminal of the first scan signal output module through the eighteenth switch transistor.

9. A shift register element, comprising: a second input module, a second control module, a second scan signal output module, and a second light emission signal output module, wherein:

the second input module comprises a first terminal connected with an input signal terminal, a second terminal connected with a first clock signal terminal, a third terminal connected with a second clock signal terminal, a fourth terminal connected with a first reference signal terminal, a fifth terminal connected with a first node, and a sixth terminal connected with a second node; and the second input module is configured to be controlled by the first clock signal terminal to provide the first node with a signal of the input signal terminal, and to be controlled by the second clock signal terminal to provide the second node with a signal of the first reference signal terminal;

the second control module comprises a first terminal connected with the first node, and a second terminal connected with the second node; and the second control module is configured to make a potential of the signal of the first node opposite to a potential of the signal of the second node;

the second scan signal output module comprises a first terminal connected with the second reference signal terminal, a second terminal connected with a third clock signal terminal, a third terminal connected with the first node, a fourth terminal connected with the second node, and a fifth terminal connected with a scan signal output terminal of the shift register element; and the second scan signal output module is configured to provide the scan signal output terminal with a signal of the third clock signal terminal when the potential of the signal of the first node is a first potential, and to provide the scan signal output terminal with a signal of the second reference signal terminal when the potential of the signal of the second node is the first potential; and to maintain a stable difference in voltage between the third terminal of the second scan signal output module and the scan signal output terminal when the first node is floating, and to maintain a stable difference in voltage between the second node and the scan signal output terminal when the second node is floating; and the second light emission signal output module comprises a first terminal connected with the first reference signal terminal, a second terminal connected with the second reference signal terminal, a third terminal connected with the second node, and a fourth terminal connected with a light emission signal output terminal of the shift register element; and the second light emission signal output module is configured to provide the light emission signal output terminal with the signal of the second reference signal terminal when the potential of the signal of the second node is the second potential, and to provide the light emission signal output terminal with the signal of the first reference signal terminal when the potential of the signal of the second node is the first potential.

10. The shift register element according to claim 9, wherein the second light emission signal output module comprises: a nineteenth switch transistor, a twentieth switch transistor, a twenty-first switch transistor, and a twenty-second switch transistor, wherein:

the nineteenth switch transistor comprises a control pole connected with the second node, a first pole connected with the first reference signal terminal, and a second pole connected respectively with a control pole of the twenty-first switch transistor, and a control pole of the twenty-second switch transistor;

the twentieth switch transistor comprises a control pole connected with the second node, a first pole connected with the second reference signal terminal, and a second pole connected respectively with the control pole of the twenty-first switch transistor, and the control pole of the twenty-second switch transistor;

the twenty-first switch transistor comprises a first pole connected with the first reference signal terminal, and a second pole connected with the light emission signal output terminal; and the twenty-second switch transistor comprises a first pole connected with the second reference signal terminal, and a second pole connected with the light emission signal output terminal.

11. The shift register element according to claim 9, wherein the second input module comprises: a twenty-third switch transistor and a twenty-fourth switch transistor, wherein:
the twenty-third switch transistor comprises a control pole connected with the first clock signal terminal, a first pole connected with the input signal terminal, and a second pole connected with the first node; and
the twenty-fourth switch transistor comprises a control pole connected with the second clock signal terminal, a first pole connected with the first reference signal terminal, and a second pole connected with the second node.

12. The shift register element according to claim 9, wherein the second control module comprises: a twenty-fifth switch transistor and a twenty-sixth switch transistor, wherein:
the twenty-fifth switch transistor comprises a control pole connected with the first node, a first pole connected with the second reference signal terminal, and a second pole connected with the second node; and
the twenty-sixth switch transistor comprises a control pole connected with the second node, a first pole connected with the second reference signal terminal, and a second pole connected with the first node.

13. The shift register element according to claim 9, wherein the second scan signal output module comprises: a twenty-seventh switch transistor, a twenty-eighth switch transistor, a fourth capacitor, and a fifth capacitor, wherein:
the twenty-seventh switch transistor comprises a control pole connected with the third terminal of the second scan signal output module, a first pole connected with the third clock signal terminal, and a second pole connected with the scan signal output terminal;
the twenty-eighth switch transistor comprises a control pole connected with the second node, a first pole connected with the second reference signal terminal, and a second pole connected with the scan signal output terminal;
the fourth capacitor is connected between the control pole of the twenty-seventh switch transistor and the scan signal output terminal; and
the fifth capacitor is connected between the second node and the scan signal output terminal.

14. A gate driver circuit, comprising a plurality of shift register elements, which are concentrated, wherein:
the input signal terminal of a first level of shift register element is connected with a frame trigger signal terminal; and
the input signal terminals of other levels of shift register elements are connected respectively with scan signal output terminals of preceding levels of shift register elements, except for the first level of shift register element;
the shift register element comprises: a first input module, a first control module, a first scan signal output module, and a first light emission signal output module, wherein:
the first input module comprises a first terminal connected with an input signal terminal, a second terminal connected with a first clock signal terminal, a third terminal connected with a second clock signal terminal, a fourth terminal connected with a first reference signal terminal, a fifth terminal connected with a first node, and a sixth terminal connected with a second node; and the first input module is configured to be controlled by the first clock signal terminal to provide the first node with a signal of the input signal terminal, and to be controlled by the second clock signal terminal to provide the second node with a signal of the first reference signal terminal;
the first control module comprises a first terminal connected with the first node, and a second terminal connected with the second node; and the first control module is configured to make a potential of the signal of the first node opposite to a potential of the signal of the second node;
the first scan signal output module comprises a first terminal connected with a second reference signal terminal, a second terminal connected with a third clock signal terminal, a third terminal connected with the first node, a fourth terminal connected with the second node, and a fifth terminal connected with a scan signal output terminal of the shift register element; and the first scan signal output module is configured to provide the scan signal output terminal with a signal of the third clock signal terminal when the potential of the signal of the first node is a first potential, and to provide the scan signal output terminal with a signal of the second reference signal terminal when the potential of the signal of the second node is the first potential; and to maintain a stable difference in voltage between the third terminal of the first scan signal output module and the scan signal output terminal when the first node is floating, and to maintain a stable difference in voltage between the second node and the scan signal output terminal when the second node is floating; and
the first light emission signal output module comprises a first terminal connected with the first reference signal terminal, a second terminal connected with the second reference signal terminal, a third terminal connected with the first node, and a fourth terminal connected with a light emission signal output terminal of the shift register element; and the first light emission signal output module is configured to provide the light emission signal output terminal with the signal of the second reference signal terminal if the potential of the signal of the first node is the first potential, and to provide the light emission signal output terminal with the signal of the first reference signal terminal when the potential of the signal of the first node is a second potential;

or the shift register element comprises: a second input module, a second control module, a second scan signal output module, and a second light emission signal output module, wherein:
the second input module comprises a first terminal connected with an input signal terminal, a second terminal connected with a first clock signal terminal, a third terminal connected with a second clock signal terminal, a fourth terminal connected with a first reference signal terminal, a fifth terminal connected with a first node, and a sixth terminal connected with a second node; and the second input module is configured to be controlled by the first clock signal terminal to provide the first node with a signal of the input signal terminal, and to be controlled by the second clock signal terminal to provide the second node with a signal of the first reference signal terminal;

the second control module comprises a first terminal connected with the first node, and a second terminal connected with the second node; and the second control module is configured to make a potential of the signal of the first node opposite to a potential of the signal of the second node;

the second scan signal output module comprises a first terminal connected with the second reference signal terminal, a second terminal connected with a third clock signal terminal, a third terminal connected with the first node, a fourth terminal connected with the second node, and a fifth terminal connected with a scan signal output terminal of the shift register element; and the second scan signal output module is configured to provide the scan signal output terminal with a signal of the third clock signal terminal when the potential of the signal of the first node is a first potential, and to provide the scan signal output terminal with a signal of the second reference signal terminal when the potential of the signal of the second node is the first potential; and to maintain a stable difference in voltage between the third terminal of the second scan signal output module and the scan signal output terminal when the first node is floating, and to maintain a stable difference in voltage between the second node and the scan signal output terminal when the second node is floating; and the second light emission signal output module comprises a first terminal connected with the first reference signal terminal, a second terminal connected with the second reference signal terminal, a third terminal connected with the second node, and a fourth terminal connected with a light emission signal output terminal of the shift register element; and the second light emission signal output module is configured to provide the light emission signal output terminal with the signal of the second reference signal terminal when the potential of the signal of the second node is the second potential, and to provide the light emission signal output terminal with the signal of the first reference signal terminal when the potential of the signal of the second node is the first potential.

15. An organic electroluminescent display panel, comprising the gate driver circuit according to claim 14, and a plurality of signal line groups comprising gate lines and light emission signal lines, wherein:

each of the signal line groups corresponds to one of the shift register elements in the gate driver circuit; and gate lines in each of the signal line groups are connected with the scan signal output terminals of a shift register element corresponding to each of the signal line groups, and the light emission signal lines are connected with the light emission signal output terminals of the shift register element corresponding to each of the signal line groups.

* * * * *